US009356557B1

(12) United States Patent
Gao et al.

(10) Patent No.: US 9,356,557 B1
(45) Date of Patent: May 31, 2016

(54) CAPACITOR ARRANGEMENT FOR OSCILLATOR

(71) Applicant: NXP B.V., Eindhoven (NL)

(72) Inventors: Yuan Gao, Eindhoven (NL); Frank Leong, Veldhoven (NL); Robert Bogdan Staszewski, Dublin (IE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/836,759

(22) Filed: Aug. 26, 2015

(51) Int. Cl.
*H03B 5/06* (2006.01)
*H03B 5/12* (2006.01)
*H03L 3/00* (2006.01)
*H03B 7/06* (2006.01)

(52) U.S. Cl.
CPC .. *H03B 7/06* (2013.01); *H03B 5/06* (2013.01); *H03B 5/1212* (2013.01); *H03B 5/1228* (2013.01); *H03B 5/1265* (2013.01); *H03B 5/1268* (2013.01); *H03L 3/00* (2013.01); *H03B 2200/0094* (2013.01); *H03B 2201/011* (2013.01); *H03B 2201/012* (2013.01); *H03B 2201/0266* (2013.01)

(58) Field of Classification Search
CPC .......... H03B 5/06; H03B 5/12; H03B 5/1206; H03B 5/1212; H03B 5/1225; H03B 5/1228; H03B 5/1262; H03B 5/1265; H03B 5/1268; H03B 2200/0094; H03B 2201/01; H03B 2201/011; H03B 2201/012; H03L 3/00
USPC ...... 331/36 C, 117 FE, 117 R, 167, 173, 181; 375/369
See application file for complete search history.

(56) References Cited

U.S. PATENT DOCUMENTS

| | | | | |
|---|---|---|---|---|
| 6,815,996 B1 * | 11/2004 | Hsiao | ...... | H03B 5/124 327/337 |
| 7,078,980 B2 * | 7/2006 | Muramatsu | .......... | H03B 5/1228 331/117 FE |
| 7,084,713 B2 * | 8/2006 | Peluso | ................. | H03B 5/1228 331/179 |

(Continued)

OTHER PUBLICATIONS

J. Ryckaert et al., "A 0.65-to-1.4 nJ/Burst 3-to-10 GHz UWB All-Digital TX in 90nm CMOS for IEEE 802.15.4a." IEEE JSSC vol. 42, No. 12, pp. 2860-2869, Dec. 2007.

(Continued)

*Primary Examiner* — Levi Gannon
(74) *Attorney, Agent, or Firm* — Rajeev Madnawat

(57) ABSTRACT

In an example embodiment, an apparatus includes an LC circuit having a capacitive circuit and an inductive circuit connected in a circuit loop. In a first mode, a switching circuit in the inductive circuit provides a charge voltage across the LC circuit and prevents oscillation of the LC circuit by opening a switch in the circuit loop. In a second mode, the switching circuit enables the oscillation of the LC circuit by closing the switch in the circuit loop. The adjustable capacitive circuit includes capacitive branch circuits configured to contribute a first amount of capacitance when enabled. For each capacitive branch circuit, an initialization circuit couples the set of capacitors to a respective reference voltage in response to the capacitive branch circuit being disabled and the switching circuit operating in the first mode.

20 Claims, 17 Drawing Sheets

(56) References Cited

U.S. PATENT DOCUMENTS

| | | | | |
|---|---|---|---|---|
| 7,230,504 | B1* | 6/2007 | Marques | H03B 5/1228 331/117 FE |
| 7,564,318 | B2* | 7/2009 | Chen | H03B 5/1228 331/117 FE |
| 7,622,980 | B2* | 11/2009 | Yeh | H03L 7/099 327/337 |
| 8,044,741 | B2* | 10/2011 | Barton | H03L 7/0991 331/117 FE |
| 8,253,506 | B2* | 8/2012 | Liu | H03L 1/023 331/117 R |
| 8,275,336 | B2* | 9/2012 | Tse-Peng | H03B 5/1228 331/117 FE |
| 2002/0040991 | A1* | 4/2002 | Embabi | H01G 2/00 257/312 |
| 2003/0227341 | A1* | 12/2003 | Sawada | H03B 5/1228 331/177 V |
| 2007/0247237 | A1* | 10/2007 | Mohammadi | H03B 5/1228 331/36 C |
| 2010/0007427 | A1* | 1/2010 | Tomita | H03H 19/004 331/117 FE |

OTHER PUBLICATIONS

S. Drago et al., "A 200 uA duty-cycled PLL for wireless sensor nodes in 65 nm CMOS." IEEE JSSC, vol. 45, No. 7, pp. 1305-1315, Jul. 2010.

Andreani P., et al., "A TX VCO for WCDMA/EDGE in 90 nm RF CMOS" IEEE JSSC, vol. 46, No. 7, Jul. 2011.

Chen, Y. et al., "A 9 GHz Dual-Mode Digitally Controlled Oscillator for GSM/UMTS Transceivers in 65 nm CMOS", IEEE Asian Solid-State Circuits Conference, Nov. 12-14, 2007; Jeju, Korea.

Chillara V. K. et al., "An 860uW 2.1-to-2.7GHz All-Digital PLL-Based Frequency Modulator with a DTC-Assisted Snapshot TDC for WPAN (Bluetooth Smart and ZigBee) Applications", IEEE International Solid-State Circuits Conference, Session 9, 2014.

Fanori L. et al., "A Class-D CMOS DCO with an on-chip LDO", IEEE 2014.

Marucci G. et al., "A 1.7GHz MDLL-Based Fractional-N Frequency Synthesizer with 1.4ps RMS Integrated Jitter and 3mW Paoer Using a 1b TDC", 2014 IEEE International Solid-State Circuits Conference.

* cited by examiner

US 9,356,557 B1

CAPACITOR ARRANGEMENT FOR OSCILLATOR

OVERVIEW

Aspects of various embodiments relate generally to capacitive circuits and, more particularly, to capacitive circuits for use in oscillator applications.

Impulse Radio Ultra Wide-Band (IR-UWB) is an increasingly popular technique for radio frequency (RF) communication. In IR-UWB radios, signals can be transmitted in the form of short pulses (or short bursts consisting of several back-to-back pulses), where the pulse/burst duration is on the order of nanoseconds while the pulse repetition rate is on the order of microseconds. Data can be encoded by changing either the phase, the amplitude, the frequency or the position of pulses realizing respectively the well-known modulation schemes of phase-shift keying (PSK), amplitude-shift keying (ASK) such as pulse amplitude modulation (PAM) or on-off keying (OOK), frequency-shift keying (FSK), or pulse-position modulation (PPM). IR-UWB transmitters and/or receivers may reduce energy use by duty-cycling oscillators and/or other components in the transmitter and/or receiver. Duty-cycling places the oscillator or other components in an inactive or powered down state for a significant fraction of the time in use (e.g., between transmitted pulses). However, oscillator circuits require a certain time period to start-up before the generated signal may be used for applications requiring high accuracy. In applications that duty-cycle circuits including oscillators, this startup time becomes an important component in the total power consumption of the electrical system. In some applications, the startup time dictates whether the chip can power down fully, or remain powered on in order to respond quickly to interruptions or other events.

Applications that duty-cycle oscillators typically utilize ring oscillators. Ring oscillators are known to be less energy efficient than LC oscillators, in the sense that they require more power for a given phase noise level. However, ring oscillators can be made in such a way that they suit instantaneous startup. While LC oscillators are energy efficient, LC oscillators typically start from a random phase and need many cycles to reach steady-state amplitude and frequency.

These and other matters have presented challenges to efficiencies of frequency synthesizer implementations, for a variety of applications.

SUMMARY

Various example embodiments are directed to apparatuses and methods for generating oscillating signals. According to an example embodiment, an apparatus includes an LC circuit having a capacitive circuit and an inductive circuit connected in a circuit loop. The inductive circuit includes one or more inductive elements and a switching circuit. In a first mode, the switching circuit provides a direct current (DC) charge voltage across the LC circuit and prevents oscillation of energy between the capacitive circuit and the inductive circuit by opening a switch in the circuit loop of the LC resonant circuit. In a second mode, the switching circuit enables the oscillation of energy between the capacitive circuit and the inductive circuit by closing the switch in the circuit loop. The adjustable capacitive circuit includes capacitive branch circuits. Each capacitive branch circuit has a respective set of capacitors and is configured to contribute a first amount of capacitance when enabled. For each of the capacitive branch circuits, an initialization circuit couples the set of capacitors to a respective reference voltage in response to the capacitive branch circuit being disabled and the switching circuit operating in the first mode.

According to another example embodiment, an adjustable capacitive circuit includes a plurality of capacitive branch circuits coupled to first and second nodes. Each capacitive branch circuit includes a respective set of capacitors. When one of the capacitive branch circuits is operated in an enabled mode, the set of capacitors of the capacitive branch circuit are configured to contribute a first amount of capacitance between the first and second nodes. When the capacitive branch circuit is operated in a disabled mode, the set of capacitors of the capacitive branch circuit are configured to contribute a second lesser amount of capacitance between the first and second nodes. In a first mode, an initialization circuit couples capacitors of each capacitive branch circuit that is disabled to respective reference voltages. In a second mode, the initialization circuit uncouples the capacitors of each capacitive branch circuit that is disabled from the respective reference voltages.

According to another example embodiment, a method is provided for operating an oscillator circuit including an adjustable capacitive circuit and an inductive circuit connected in a circuit loop. A subset of a plurality of capacitor branch circuits in the adjustable capacitive circuit are enabled and other ones of the capacitor branch circuits are disabled. Each of the plurality of capacitor branch circuits includes a respective set of capacitors and is configured and arranged to provide a first capacitance between first and second nodes when enabled, and provide a second lesser capacitance between the first and second nodes when disabled. In a first mode, oscillation of the LC circuit is prevented by opening a switch in the circuit loop of the LC circuit. For each disabled capacitive branch circuit, an initialization circuit also couples capacitors in the capacitive branch circuit to respective reference voltages. The capacitive circuit is also charged in the first mode by providing a charge voltage across the LC circuit. In a second mode, the initialization circuit uncouples the capacitors of disabled capacitive branch circuits from the respective reference voltages and the oscillation of the LC circuit is enabled by closing the switch in the circuit loop. The charge on enabled branch circuits of the capacitive circuit causes the LC circuit to oscillate with a single-ended peak-to-peak amplitude equal to the charge voltage of the capacitive circuit nearly instantaneously after the oscillation is enabled.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which:

FIG. 8-1 shows a waveform illustrating voltage at a first node of an adjustable capacitive circuit during startup of an oscillator circuit without initialization of the adjustable capacitive circuit;

FIG. 8-2 shows a waveform illustrating voltage at a second node of an adjustable capacitive circuit during startup of an oscillator circuit without initialization of the adjustable capacitive circuit;

FIG. 8-3 shows an oscillating signal generated during startup of an oscillator circuit without initialization of an adjustable capacitive circuit included in the oscillator circuit;

FIG. 8-4 shows oscillation frequency of an oscillator circuit during startup without initialization of an adjustable capacitive circuit included in the oscillator circuit;

FIG. 9-1 shows a waveform illustrating voltage at a first node of an adjustable capacitive circuit during startup of an oscillator circuit with initialization of the adjustable capacitive circuit;

FIG. 9-2 shows a waveform illustrating voltage at a second node of an adjustable capacitive circuit during startup of an oscillator circuit with initialization of the adjustable capacitive circuit;

FIG. 9-3 shows an oscillating signal generated during startup of an oscillator circuit with initialization of an adjustable capacitive circuit included in the oscillator circuit;

FIG. 9-4 shows oscillation frequency of an oscillator circuit during startup with initialization of an adjustable capacitive circuit included in the oscillator circuit;

Figure 1:
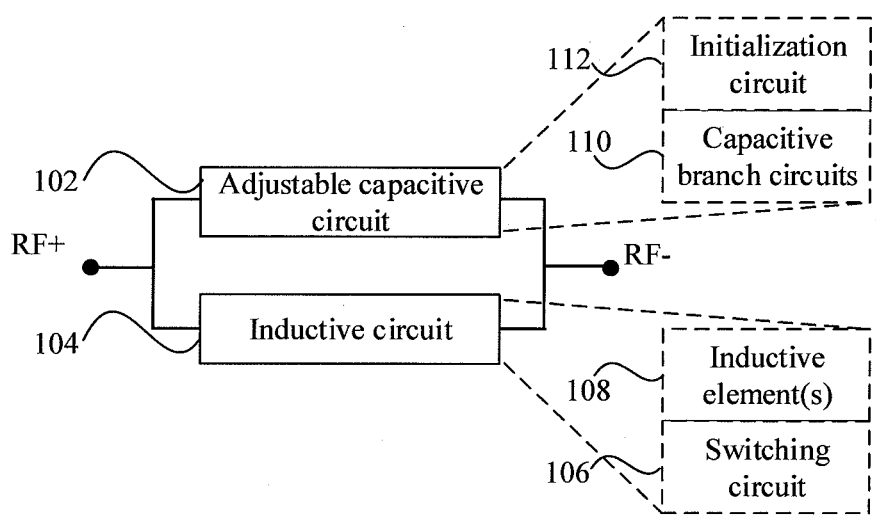
FIG. 1 shows a block diagram for an oscillator circuit, consistent with one or more embodiments of the present disclosure.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems, and methods involving oscillator circuits having an adjustable capacitive circuit. In certain implementations, aspects of the present disclosure have been shown to be beneficial when used in the context of applications involving duty-cycled operation of oscillator circuits. While not necessarily so limited, various aspects may be appreciated through a discussion of examples using such exemplary contexts.

Some example embodiments are directed to energy-efficient oscillator circuits that exhibit near instantaneous startup. According to an example embodiment, an oscillator circuit includes an LC circuit having an inductive circuit and adjustable capacitive circuit connected in a circuit loop. The LC circuit generates an oscillating signal at first and second nodes. The frequency of the oscillating signal is primarily determined by the inductance and capacitance provided by the inductive circuit and adjustable capacitive circuits. The adjustable capacitive circuit allows the oscillation frequency to be configured by adjusting capacitance of the LC circuit. The ability to adjust oscillation frequency allows an oscillator to be used for a wider number of applications. In some implementations, an amplifier circuit is configured to reinforce oscillation of the LC circuit.

In some implementations, the inductive circuit includes one or more inductive elements and a switching circuit. In a first mode, the switching circuit prevents oscillation of the LC circuit and provides a charge voltage across the LC circuit—thereby charging the adjustable capacitive circuit. In a second mode, the switching circuit enables the oscillation of the LC circuit. By charging the adjustable capacitive circuit in the first mode, the LC circuit oscillates with a single-ended peak-to-peak amplitude equal to the charge voltage of the capacitive circuit nearly instantaneously when the oscillation is enabled. However, providing a charge voltage across the LC circuit in the first mode may cause problems for many adjustable capacitive circuits. Adjustable capacitive circuits often include a network of several capacitors configurable to mimic a true capacitor with various amounts of capacitance. For example, an adjustable capacitor may include a plurality of capacitive branch circuits that may be individually enabled or disabled to adjust a total amount of capacitance. As explained in more detail with reference to the Figures, capacitors in disabled capacitive branch circuit may incidentally store some amount of charge. Charged capacitors in a disabled capacitive branch may push voltage of one or more nodes in the circuit outside of a voltage range of a rail-to-rail supply voltage (e.g., between Vdd and Ground) use to power the oscillator. A node having a voltage outside of the rail-to-rail supply voltage range may cause switches which are designed to be off and parasitic PN junctions to be turned on, preventing the transistors from operating correctly.

In one or more embodiments, the LC circuit includes an adjustable capacitor including a plurality of capacitor branch circuits and an initialization circuit configured to limit charging of capacitors in disabled branch circuits while pre-charging the adjustable capacitive circuit in the first mode of operation. Charging of a capacitor may be limited by couping a capacitor to a reference voltage approximately equal to a charge voltage used to charge the adjustable capacitive circuit. Various circuit arrangements may be used to limit charging of capacitors in disabled capacitive branch circuits. For example, the initialization circuit may limit charging of a capacitor in a disabled capacitive branch circuit by coupling one end of a capacitor to a reference voltage approximately equal to a voltage presented to the other end of the capacitor when charging the adjustable capacitive circuit. In this manner, the voltage drop across the capacitor can be limited to a small value.

The LC circuit may also be implemented using various inductive circuit arrangements. In some embodiments, the inductive circuit includes a switching circuit, a first and second magnetically coupled inductor coils. The first inductor coil has a first end coupled to the first output node and a second end coupled to the switching circuit. The second inductor coil has a first end coupled to the second output node and a second end coupled to the switching circuit.

In the first mode, the switching circuit uncouples the second end of the first inductor coil from the second end of the second inductor coil—thereby opening the circuit loop of the LC circuit and disabling the oscillation. In the first mode, the switching circuit also couples the second end of the first inductor coil to a first power terminal (e.g., a node providing a supply voltage), and couples the second end of the second inductor coil to a second power terminal (e.g., a node providing ground). After an initial charging period, the inductor coils act as closed circuits, thereby coupling the first output node to the supply voltage and the second output node to ground. As a result, a voltage difference is provided across the capacitive circuit. In the second mode, the switching circuit uncouples the first inductor coil from the first power terminal and uncouples the second inductor coil from the second power terminal. The switching circuit also couples the second end of the first inductor coil to the second end of the second inductor coil—thereby closing the circuit loop of the LC circuit and enabling the oscillation.

It is recognized that a significant component of power consumption in a PLL can be from the RF oscillator circuit. Embodiments of the present disclosure are directed toward the use of LC oscillator circuits, which can require less power for a given phase noise level, when compared to other oscillator circuits, such as inverter-based ring oscillator circuits. Various aspects also recognize that LC oscillators can start from a random phase and may need many cycles to reach a steady-state amplitude and frequency. Various embodiments allow for the reduction of phase noise, relative to a ring oscillator with comparable power consumption, by one or even over two orders of magnitude, and for lower sensitivity to supply variations. Consistent with embodiments and in addition to reduced power in the oscillator circuit itself, power can be saved in subsequent circuits that receive the RF signal from the oscillator circuit.

The frequency of the oscillation is primarily determined by the inductance and capacitance provided by the inductive and capacitive circuits. In various implementations, the capacitive circuit may provide a fixed capacitance between the first and second output nodes, or may be programmable to adjust the capacitance and thereby tune the self-resonant frequency of the LC circuit. Similarly, in various implementations, the inductive circuit may provide a fixed inductance or may be configured to provide a programmable inductance.

The disclosed oscillator circuits may be adapted for use in various duty-cycled applications. As an illustrative example, in some applications, the oscillator circuit can be used for wireless transmission of impulse RF signals. For instance, the RF signal from the oscillator circuit can be selectively presented, in an enabled state, to an antenna to produce impulses. The oscillator circuit can be transitioned from the enabled state to a disabled state between the pulses to save power. Particular embodiments relate to an IR-UWB communication system (e.g., a transmitter or a receiver) that may include an oscillator circuit that is configured for fast startup to correspond to duty-cycling for the pulses of the IR-UWB communications, consistent with one or more disclosed embodiments. The IR-UWB transmitter or receiver can include a duty-cycle control circuit that is configured to disable, or power down, the oscillator circuit between pulses of a communicated RF signal. Prior to enabling the oscillator circuit, the duty-cycle control circuit can pre-charge the capacitive circuit using a switching circuit, consistent with various embodiments discussed herein. An example IR-UWB communication system is described in more detail with reference to FIG. 11.

Turning to the figures, FIG. 1 shows a block diagram for an oscillator circuit, consistent with one or more embodiments of the present disclosure. In this example, the oscillator circuit includes a capacitive circuit 102 and an inductive circuit 104 connected in a circuit loop to form an LC circuit. When the circuit loop is closed, energy transfers back and forth between the adjustable capacitive circuit 102 and the inductive circuit 104—thereby generating an oscillating signal at outputs RF+ and RF−. The inductive circuit 104 includes one or more inductive elements 108 and a switching circuit 106. In a first mode, a switching circuit 106 prevents oscillation of energy between the capacitive circuit 102 and the inductive circuit 104 by opening a switch (not shown) in the circuit loop of the LC circuit. In the first mode, the switching circuit 106 also charges the capacitive circuit 102 by providing a DC charge voltage across the LC circuit. In a second mode, the switching circuit 106 closes the switch in the circuit loop to enable the oscillation of energy between the capacitive circuit and the inductive circuit.

As previously discussed, the frequency of the oscillation of the LC circuit is primarily determined by the inductance and capacitance provided by the inductive and adjustable capacitive circuits. More specifically, the oscillating frequency $f_0$ of the LC circuit in Hertz is given by:

$$f_0 = \frac{1}{2\pi\sqrt{LC}}$$

where L is the inductance provided by the inductive circuit and C is the capacitance provided by the capacitive circuit. The oscillating frequency may be adjusted by adjusting L, C, or both. In this example, the oscillator circuit includes an adjustable capacitive circuit 102 that may be programmed to provide various capacitance values, such as through the use of switched capacitive banks. In this manner, the adjustable capacitive circuit 102 may be adjusted to configure the oscillator circuit to operate at various oscillating frequencies. Additionally, the oscillator circuit may include a variable inductive circuit that may also be programmed to provide various amounts of inductance.

Consistent with one or more embodiments, the adjustable capacitive circuit 102 includes a set of capacitive branch circuits 110, each configured to provide a respective capacitance between nodes RF+ and RF− when enabled. The adjustable capacitive circuit 102 also includes an initialization circuit 112 configured to limit charging of capacitors in disabled ones of the capacitive branch circuits 110. The capacitive branch circuits 110 may be implemented using various capacitive circuit arrangements. In some implementations, each of the capacitive branch circuits 110 includes two separate capacitors (not shown in FIG. 1), each having a first end coupled to a respective one of nodes RF+ and RF−. Each of the capacitive branch circuits 110 also includes a respective switching circuit (not shown in FIG. 1) configured to connect second ends of the two capacitive circuits to each other when the capacitive branch circuit is enabled. In some implementations, the respective switching circuit in each capacitive branch circuit is further configured to couple the second ends of the two capacitors to a reference voltage (e.g., Ground) when the capacitive branch circuit is enabled.

Figure 2:
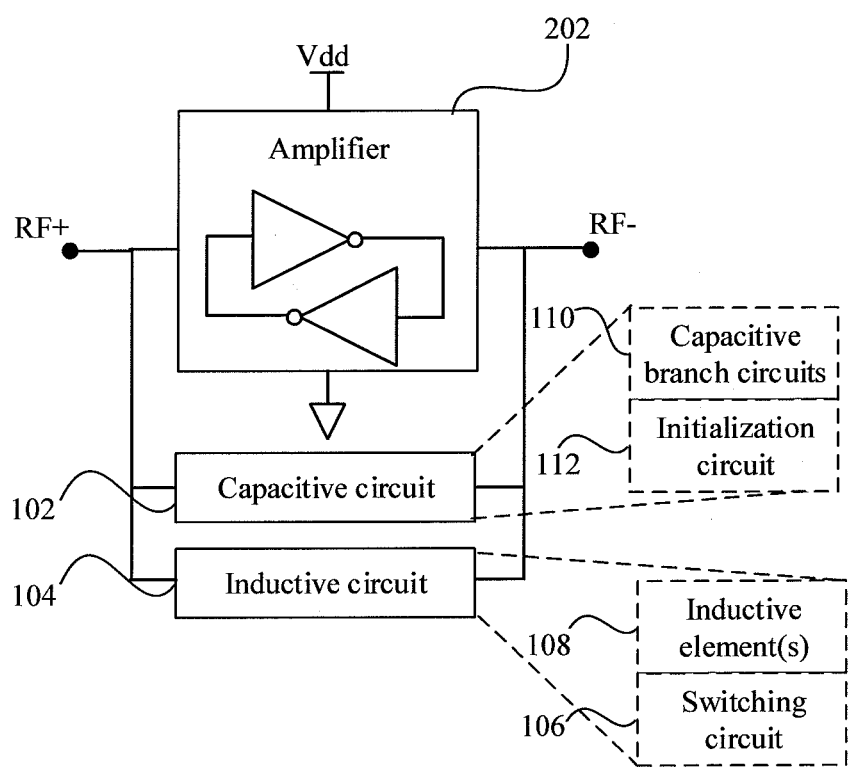
FIG. 2 shows a block diagram for an oscillator circuit that includes an amplifier circuit, consistent with one or more embodiments of the present disclosure.

FIG. 2 shows a block diagram for an oscillator circuit that includes cross-coupled inverters, consistent with one or more embodiments of the present disclosure. The oscillator circuit includes a capacitive circuit 102 and an inductive circuit 104 connected in a circuit loop as described with reference to FIG. 1. In this example, the oscillator also includes an amplifier circuit 202 configured to reinforce and control the oscillation of the LC circuit so that the oscillation may be sustained. In some implementations, the amplifier includes a pair of cross-coupled inverters. Each inverter of the pair has an input coupled to an output of the other inverter. Switching by the inverters prevents dampening of the oscillation signal. Consistent with embodiments, the switching circuit 106 can be configured to break the circuit loop in the LC circuit formed by the adjustable capacitive circuit 102 and the inductive circuit 104 such that the oscillation is prevented and the adjustable capacitive circuit 102 is pre-charged to a steady-state voltage.

Figure 3:
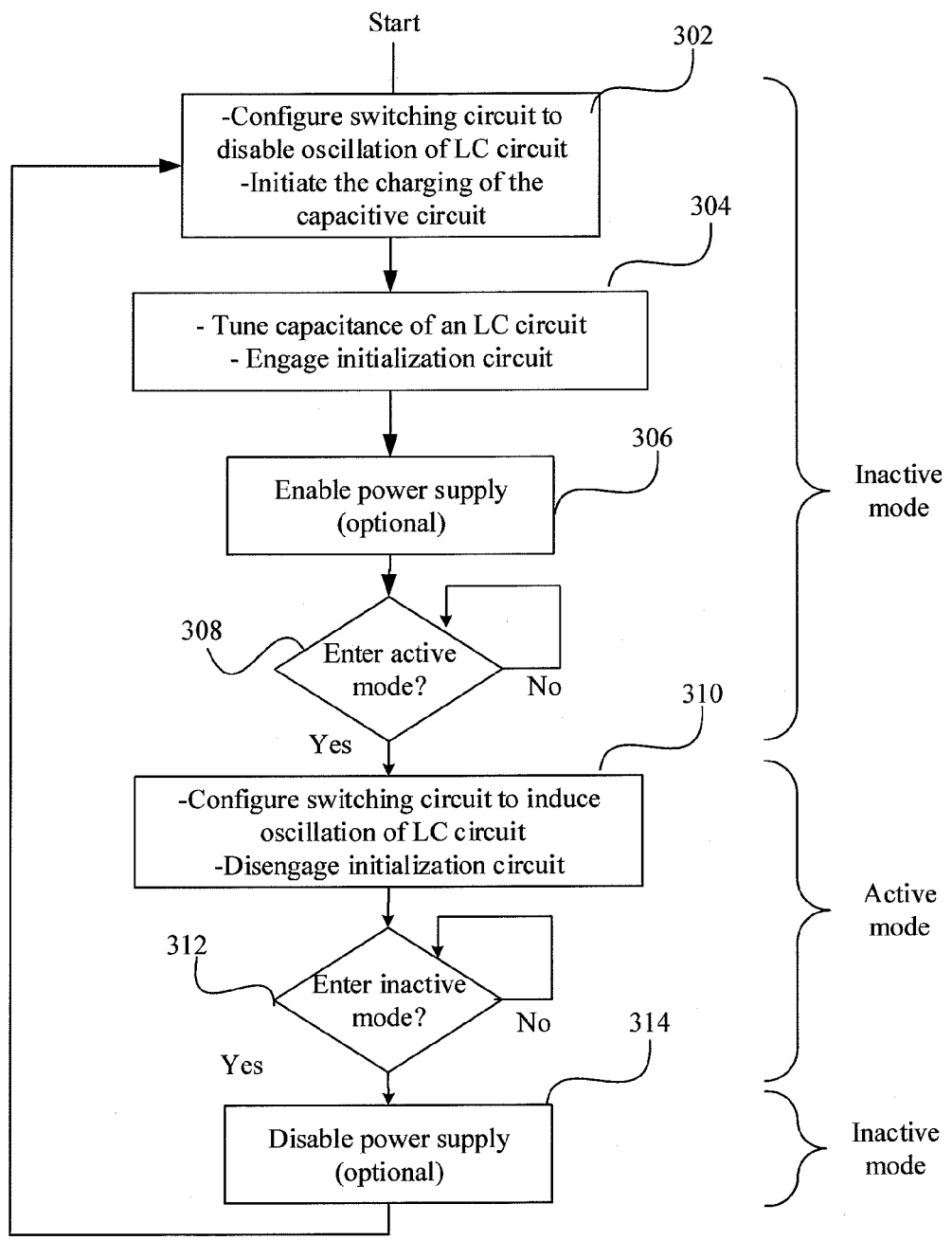
FIG. 3 shows a flow diagram for operating a configurable oscillator circuit, consistent with one or more embodiments of the present disclosure.

FIG. 3 shows a flow diagram for operating an oscillator circuit, consistent with one or more embodiments of the present disclosure. At system startup, the oscillator enters an inactive mode beginning at block 302. At block 302, a switching circuit is configured to prevent oscillation of an LC circuit, for example, by opening a circuit loop in the LC circuit. As described in more detail with reference to FIG. 4, a circuit loop may be opened by a switch in response to setting an enable signal (e.g., EN) to logic 0 and closed in response to setting the enable signal to logic 1. Also at block 302, charging of a capacitive circuit in the LC circuit is initiated.

At block 304, capacitance of the LC circuit is tuned by enabling a subset of capacitor branch circuits in the capacitive circuit and disabling other capacitive branch circuits. As described in more detail with reference to FIG. 4, capacitor branch circuits may be enabled by setting a respective control signal (e.g., $D_{cap}$) to logic 1 and disabled by setting the respective control signal to a logic 0. Also at block 304, an initialization circuit is engaged to limit charging of disabled capacitive branch circuits prior to oscillation (e.g., by coupling ends of respective capacitors to reference voltage nodes).

In some implementations, a power supply may be enabled at block 306 (if previously disabled). For example, a power supply used to power the oscillator may be powered down or disabled, when the oscillator is inactive. In some other embodiments, the power supply may remain powered up and/or enabled, when the oscillator is inactive. A small ramp-up time may be needed by the power supply to transition from a disabled/powered down to an enabled/powered up state (e.g., to drive a supply terminal from 0 volts to Vdd). During the ramp-up of the power supply, the configuration of the switching circuit at block 302 causes a charge voltage to be presented across the adjustable capacitive circuit of the LC circuit.

In response to a command to operate the oscillator in an active mode, decision block 308 directs the process to block 310. At block 310, the switching circuit is configured to induce the oscillation of the LC circuit and disengage initialization circuit. Oscillation may be induced by closing the circuit loop of the LC circuit (e.g., by setting the enable signal EN to logic 1). Due to the charge on the capacitive circuit provided in the inactive mode, full amplitude oscillation is induced in the LC circuit nearly instantaneously (e.g., within one oscillation cycle) The oscillation continues until a command is received to operate the oscillator in an inactive mode. In response to a command to operate the oscillator in an inactive mode, decision block 312 directs the process back to block 302. In some embodiments, the process may disable a power supply at block 314 before proceeding to block 302.

Figure 4:
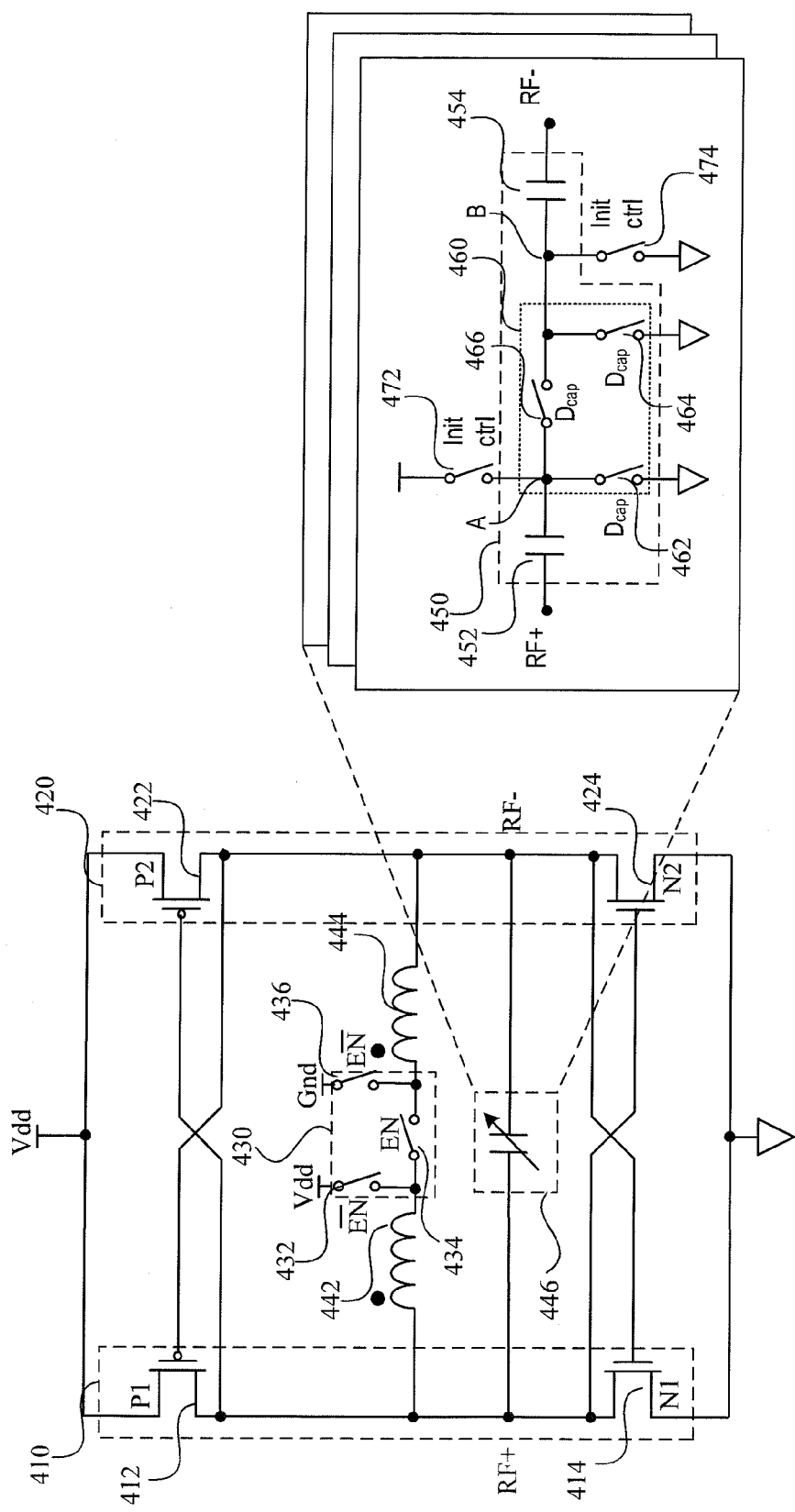
FIG. 4 shows an oscillator circuit, consistent with one or more embodiments of the present disclosure.

FIG. 4 shows an oscillator circuit, consistent with one or more embodiments of the present disclosure. The oscillator includes a capacitive circuit 446 and an inductive circuit including inductive elements 442 and 444 and a switching circuit 430 configured as discussed with reference to the capacitive circuit 102 and inductive circuit 104 shown in FIGS. 1 and 2. In this example, the oscillator also includes an amplifier having a pair of cross-coupled inverters 410 and 420 as described with reference to amplifier 202 shown in FIG. 2. In this example, each of the inverters 410 and 420 includes a P-type pull-up transistor 412 and 422, having a source coupled to a first power terminal (Vdd) and a drain coupled to a respective one of the output nodes: RF+ and RF−. Each of the inverters 410 and 420 also includes an N-type pull-down transistor 414 and 424, having a source coupled to a second power terminal (Ground) and a drain coupled to the respective one of the output nodes of the oscillator circuit (indicated by nodes RF+ and RF−). Node RF+ is connected to an output of inverter 410 and RF− is connected to an output of inverter 420. The input of inverter 410 is connected to the gates of transistors 412 and 414. The input of the inverter 410 is coupled to the output node (RF−). Gates of transistors 422 and 424 form an input node of the inverter 420, which is coupled to the output node (RF+) of inverter 410.

As previously described, the inverters 410 and 420 are configured to sustain the oscillation of the LC circuit. For instance, when the voltage at node RF+ rises above a first threshold voltage, transistor 424 reinforces the oscillation signal by pulling the node RF− down to the voltage of the second power terminal (Ground), which causes transistor 412 to pull the node RF+ up to the voltage of the first power terminal (Vdd). Conversely, when voltage of node RF− rises above the first threshold voltage, transistor 414 reinforces the oscillation signal by pulling the node RF+ down to the voltage of the second power terminal (Ground), which causes transistor 422 to pull the node RF− up to the voltage of the first power terminal (Vdd).

As previously discussed, the oscillator circuits may be implemented using various inductive and capacitive circuits. In this example, the inductive circuit includes two magnetically coupled inductor coils 442 and 444. The magnetic coupling of the inductor coils 442 and 444 is illustrated using dot notation in FIG. 4. The first one of the inductors 442 has a first end coupled to a first output node RF+ and a second end coupled to the switching circuit 430. The second one of the inductor coils 444 has a first end coupled to a second output node RF− and a second end coupled to the switching circuit 430.

The switching circuit 430 includes a switch 434 configured to couple the second end of the inductor coil 442 to the second end of the inductor coil 444 when closed. A second switch 432 is configured to couple inductor coil 442 to the first power terminal (Vdd) when closed. A third switch 436 is configured to couple inductor coil 444 to the second power terminal (Ground) when closed.

In this example, the switching circuit 430 operates in a first mode in response to a first control signal (e.g., $\overline{\text{En}}$) and in a second mode in response to a second control signal (e.g., En). The $\overline{\text{En}}$ control signal is the logical inverse of the En control signal. In the first mode, switch 434 is opened and the LC circuit loop formed by the inductive circuit 442 and 444 and capacitive circuit 446 is opened. As a result, the oscillation of energy between the inductive circuit 442 and 444 and the capacitive circuit 446 is prevented. In the first mode, switches 432 and 436 are closed, thereby coupling the second end of inductor 442 to the first power terminal (Vdd) and the second end of inductor 444 to the second power terminal (Ground).

When a voltage difference (e.g., Vdd-Ground) is applied to the power terminals, current flows through the inductor coils, which pulls output node RF+ up to Vdd and pulls output node RF− down to Ground. As a result, inverters 410 and 420 are set to respectively hold output nodes RF+ and RF− at Vdd and Ground and the capacitive circuit 446 is charged.

In the second mode, switches 432 and 436 are opened, and switch 434 is closed. As a result, the LC circuit loop formed by the inductive circuit 442 and 444 and capacitive circuit 446 is closed. When the LC circuit loop is closed, the oscillation of energy is induced between the inductive circuit 442 and 444 and capacitive circuit 446, thereby generating an oscillation signal at the output nodes RF+ and RF−. Due to the energy stored in the capacitive circuit while in the first mode, the oscillation signal oscillates at full amplitude nearly instantaneously (e.g., within the first oscillation cycle).

When a single-ended peak amplitude is used, the ideal amplitude of the oscillator can be equal to half of a supply voltage, which is used to drive the oscillator circuit. If a differential peak amplitude or a single-ended peak-to-peak amplitude is used, the ideal amplitude can be equal to the full supply voltage. For a differential peak-to-peak amplitude, the ideal amplitude can be equal to double the full supply voltage. It is recognized that the exact amplitude of oscillation can be slightly less than the ideal amplitude.

The adjustable capacitive circuit 446 may be implemented using various capacitive circuit arrangements. In this example, the adjustable capacitive circuit 446 includes a plurality of capacitive branch circuits 450. Each capacitive branch circuit 450 is configured to provide a respective capacitance between nodes RF+ and RF− when enabled by a respective control signal for the capacitive branch circuit ($D_{cap}$). The $D_{cap}$ control signal for each capacitive branch circuit 450 may be provided as a respective bit of a control word, with each bit corresponding to a different capacitive branch circuit 450.

In this example, each capacitive branch circuit 450 includes a first capacitor 452 having a first end coupled to node RF+ and a second end coupled to a switching circuit 460. Each capacitive branch circuit 450 also includes a second capacitor 454 having a first end coupled to node RF− and a second end coupled to the switching circuit 460. When the capacitive branch circuit 450 is enabled, switch 466 of the switching circuit 460 couples the second end of capacitor 452 to the second end of capacitor 454. When the switching circuit 460 couples the second end of capacitor 452 to the second end of capacitor 454, a circuit path including the capacitors 452 and 454 is completed between the nodes RF+ and RF−. When the capacitive branch circuit 450 is enabled, switches 462 and 464 also couple the second ends of the capacitors 452 and 454 to a power terminal (e.g., providing a ground voltage). When the capacitive branch circuit 450 is disabled, the switching circuit 460 uncouples capacitor 452 from capacitor 454—thereby breaking the circuit path between the nodes RF+ and RF− via the capacitors 452 and 454. When the capacitive branch circuit 450 is disabled, switches 462 and 464 also uncouple the second ends of the capacitors 452 and 454 from the power terminal (e.g., providing a ground voltage).

When the switching circuit 430 is operating in the first mode, node RF+ is held at Vdd, node RF− is held at ground. Alternatively, in some embodiments, node RF− is held at Vdd and node RF+ is held at ground when the switching circuit 430 is operating in the first mode, if the initialization circuit is flipped horizontally. Without an initialization circuit nodes A and B would be free floating in each of the disabled capacitive branches 450 (i.e., branches having $D_{cap}$ set to logic 0), when the switching circuit 430 is in the first mode When the oscillator transitions to the second mode, voltages at nodes RF+ and RF− begin to oscillate, pulling node RF+ down to Ground nearly instantaneously Since RF+ and RF− may oscillate approximately rail-to-rail (e.g., between Vdd and Ground), capacitors 452 and 454 having a first end connected to nodes RF+ and RF− may cause a second end of the capacitors (nodes A and B) to exceed Vdd or fall below Gnd if there was charge stored in the capacitors prior to oscillation. When this happens, a parasitic PN junction of the switch 446, e.g. from P substrate to the source/drain of switch 446, e.g. node A, may be turned on and cause circuit failure.

The adjustable capacitive circuit 446 includes an initialization circuit configured to limit charging of capacitors in the capacitive branch circuits 450 when disabled. As previously described, charging of a capacitor may be limited by coupling a capacitor to a reference voltage approximately equal to a charge voltage used to charge the adjustable capacitive circuit. In this example, the initialization circuit includes a respective set switches 472 and 474 for each capacitive branch circuit. The switches 472 and 474 are configured to limit charging of capacitors in a respective capacitive branch circuit 450 in response to a respective control signal (Init_Ctrl) corresponding to the capacitive branch circuit 450. The respective Init_Ctrl control signal for a capacitive branch circuit 450 may be generated for example, by performing a logical AND of $\overline{En}$ and the $\overline{D_{cap}}$ control signal for the capacitive branch circuit 450.

As previously indicated, node RF+ is held at Vdd and RF− is held at Ground when the switching circuit 430 is operating in the first mode. If the capacitive branch circuit 450 is disabled in the first mode, the Init_Ctrl signal causes switch 472 of the initialization circuit to couple node A to Vdd, thereby discharging capacitor 452. The Init_Ctrl signal also causes switch 474 of the inductive circuit to also couple node B to Ground, thereby discharging capacitor 454.

The circuit depicted in FIG. 4 is consistent with a complementary class-B LC oscillator. However, various embodiments are not necessarily limited to the specific configuration depicted in FIG. 4. For example, different embodiments are contemplated in which variations can be made to the specific configuration of the circuit configured to provide transconductance to reinforce the oscillation (e.g., inverter circuits 410 and 420).

Figure 5:
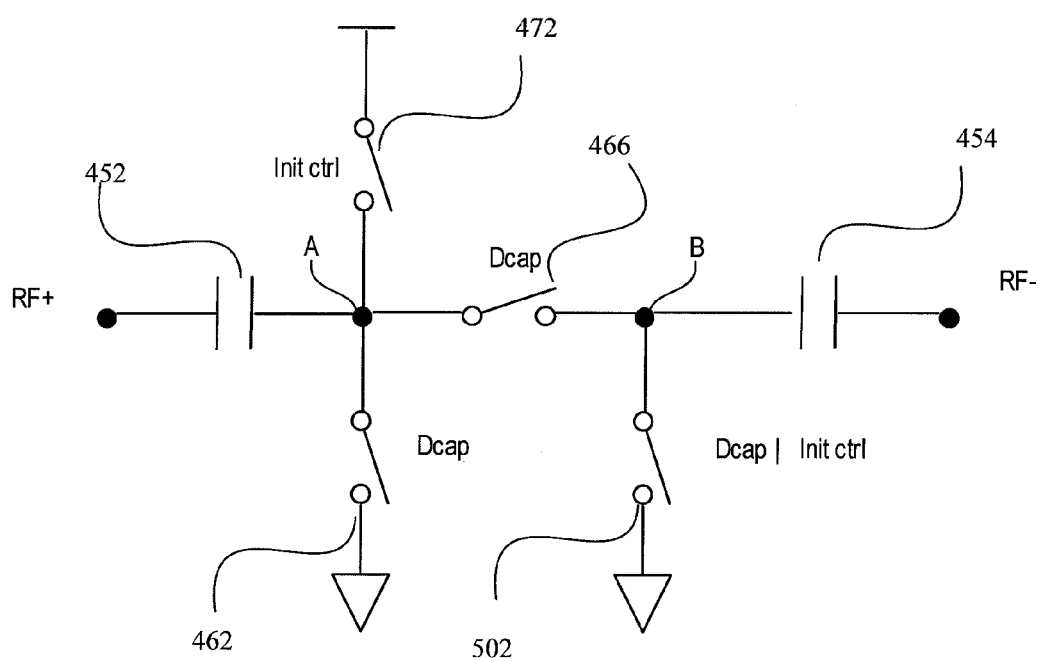
FIG. 5 shows an example switched capacitive circuit, consistent with one or more embodiments of the present disclosure.

An adjustable capacitive circuit may be implemented using various circuit arrangements in addition to, or in lieu of, the adjustable capacitive circuit arrangement 446 shown in FIG. 4. For example, FIG. 5 shows an example switched capacitive circuit 500 that may be used to implement one or more capacitive branch circuits in an adjustable capacitive circuit. The switched capacitive circuit 500 is functionally equivalent to the capacitive circuit formed by elements 452, 454, 462, 464, 466, 472, and 474 in FIG. 4. In this example, the switched capacitive circuit 500 includes a switch 502 that performs switching operations of both switches 464 and 474 in FIG. 4. The switch 502 couples node B to Ground responsive to a control signal derived from a logical OR of the $D_{cap}$ and Init_Ctrl control signals.

Figure 6:
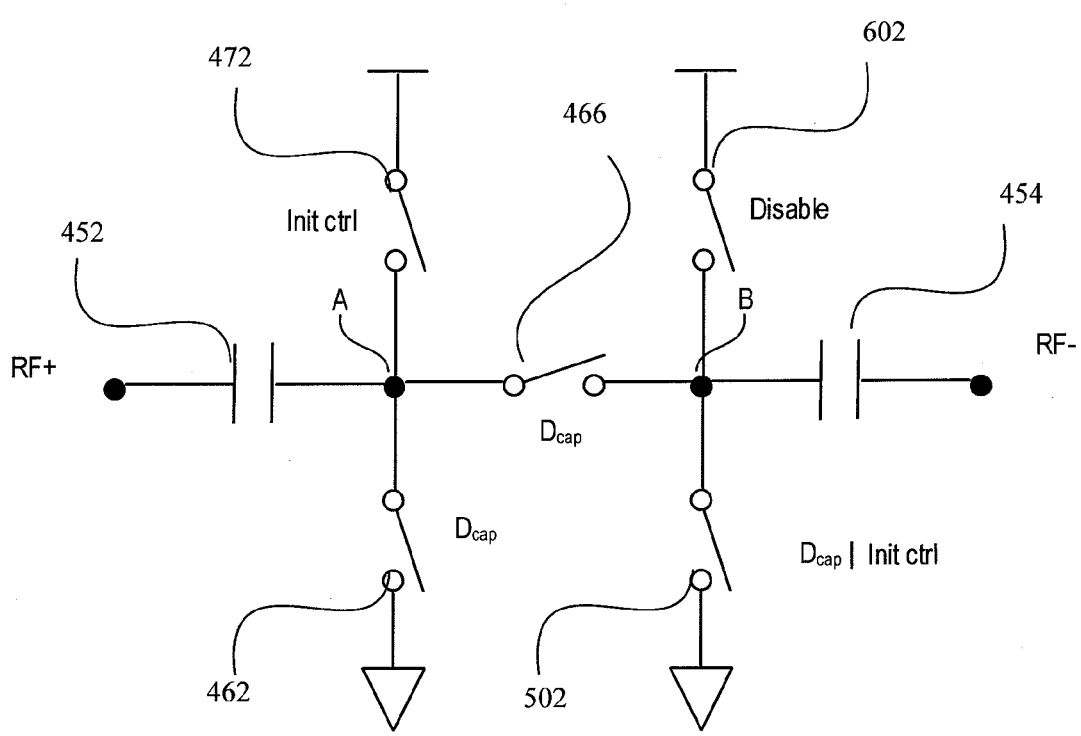
FIG. 6 shows another example switched capacitive circuit, consistent with one or more embodiments of the present disclosure.

FIG. 6 shows another example switched capacitive circuit, consistent with one or more embodiments of the present disclosure. The switched capacitive circuit 600 is similar to the switched capacitive circuit 500 shown in FIG. 5, but includes an additional switch 602 between node B and Vdd. The switch 602 is configured by a disable signal to be open at all times. The addition of switch 602 to switches 472, 462, and 502 provides a symmetrical parasitic capacitance between switch 466 and nodes RF+ and RF− when switches are implemented using transistor-based switches. For example, MOS- FET transistors exhibit an amount of capacitance between source and drain terminals. If MOSFETs are used to implement switches 462, 464, 466, and 472 in FIG. 5, node A has a larger parasitic capacitance to AC ground in comparison to node B. The excessive parasitic capacitance at node A does not has effect when the switched capacitive circuit 500 is enabled and both nodes A and node B are grounded. However, when the capacitance circuit 500 is disabled, the excessive capacitance at node A results in a larger capacitance from RF+ to AC ground than RF−. The addition of the switch 602 balances capacitance in the capacitive circuit 600 without changing switch functionality.

For ease of explanation and illustration, the examples are primarily described with reference to LC circuits having one adjustable capacitor. However, the embodiments are not so limited. For example, in some embodiments, an LC circuit may include a plurality of adjustable capacitive circuits. In some implementations, the plurality of adjustable capacitive circuits may be configured to provide different ranges of capacitances. For instance, an adjustable capacitive circuit may include a first adjustable capacitive circuit configured to adjust capacitance in coarse increments and a second adjustable capacitive circuit configured to adjust capacitance in fine increments.

Figure 7:
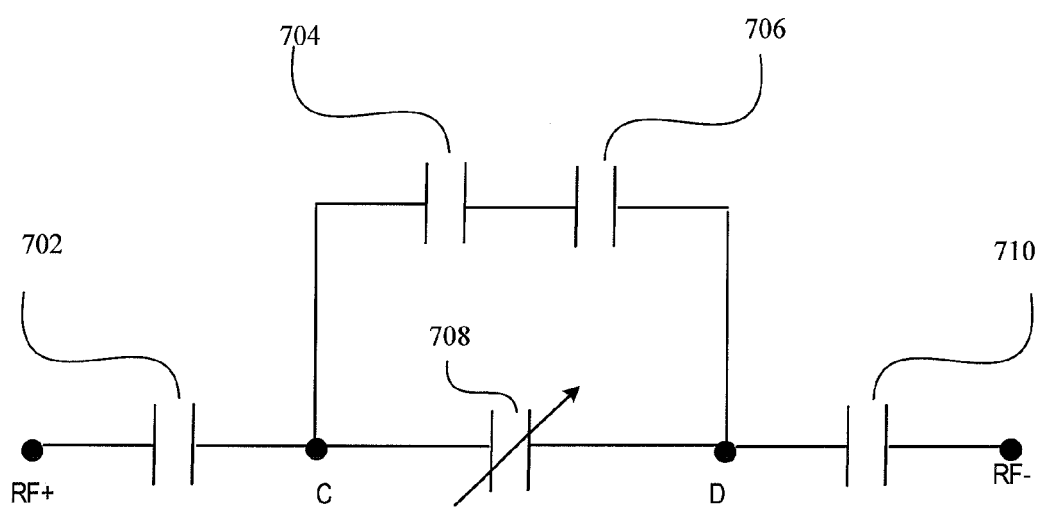
FIG. 7 shows an adjustable capacitive circuit configured for fine adjustment of capacitance, consistent with one or more embodiments of the present disclosure

FIG. 7 shows an adjustable capacitive circuit configured for fine adjustment of capacitance, consistent with one or more embodiments of the present disclosure. In this example, the capacitive circuit 700 includes an adjustable capacitor 708 connected in series between capacitive elements 702 and 710. The capacitive circuit 700 also includes a capacitive circuit having capacitive elements 704 and 706 coupled in series between one end of the adjustable capacitor 708 (node C) and a second end of the adjustable capacitor 708 (node D). In this arrangement, capacitance is adjusted in smaller increments in comparison to adjustable capacitor arrangements shown in FIGS. 5 and 6, for example.

Figures 1, 8:
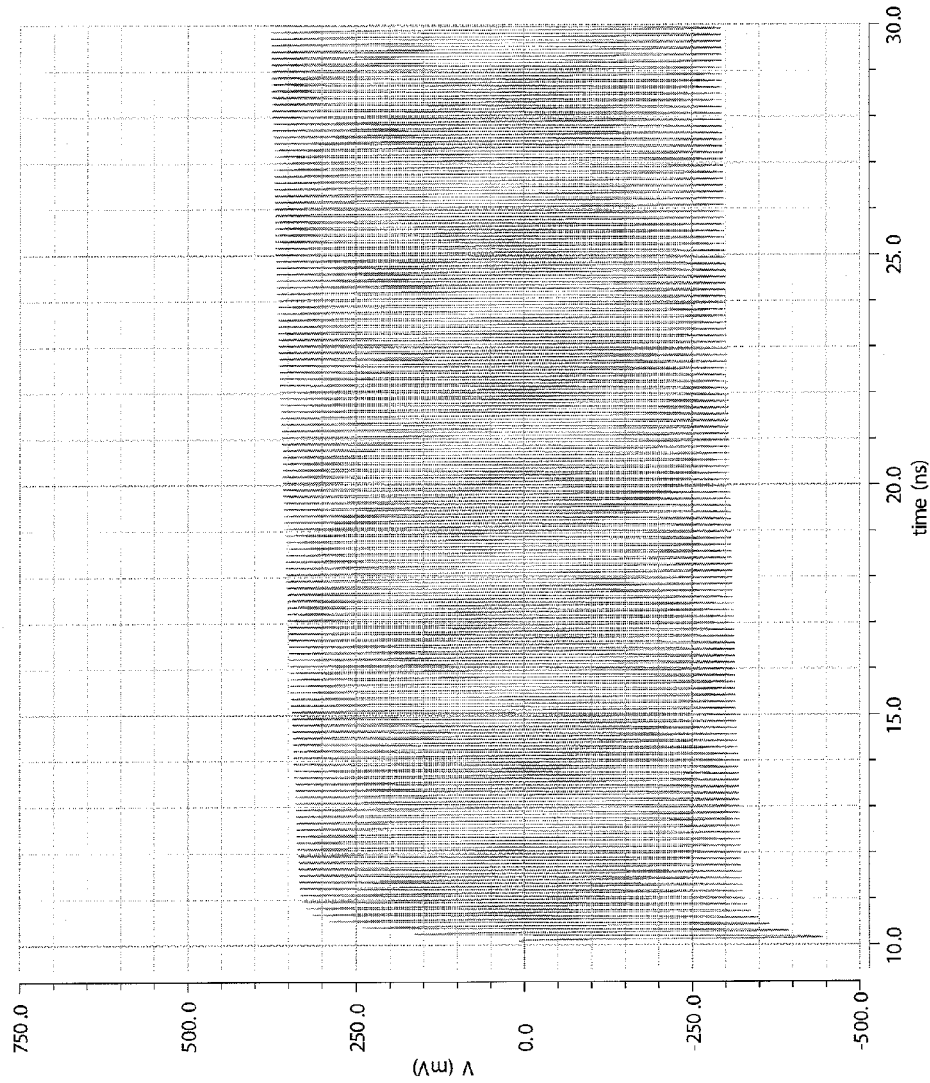
Figures 2, 8:
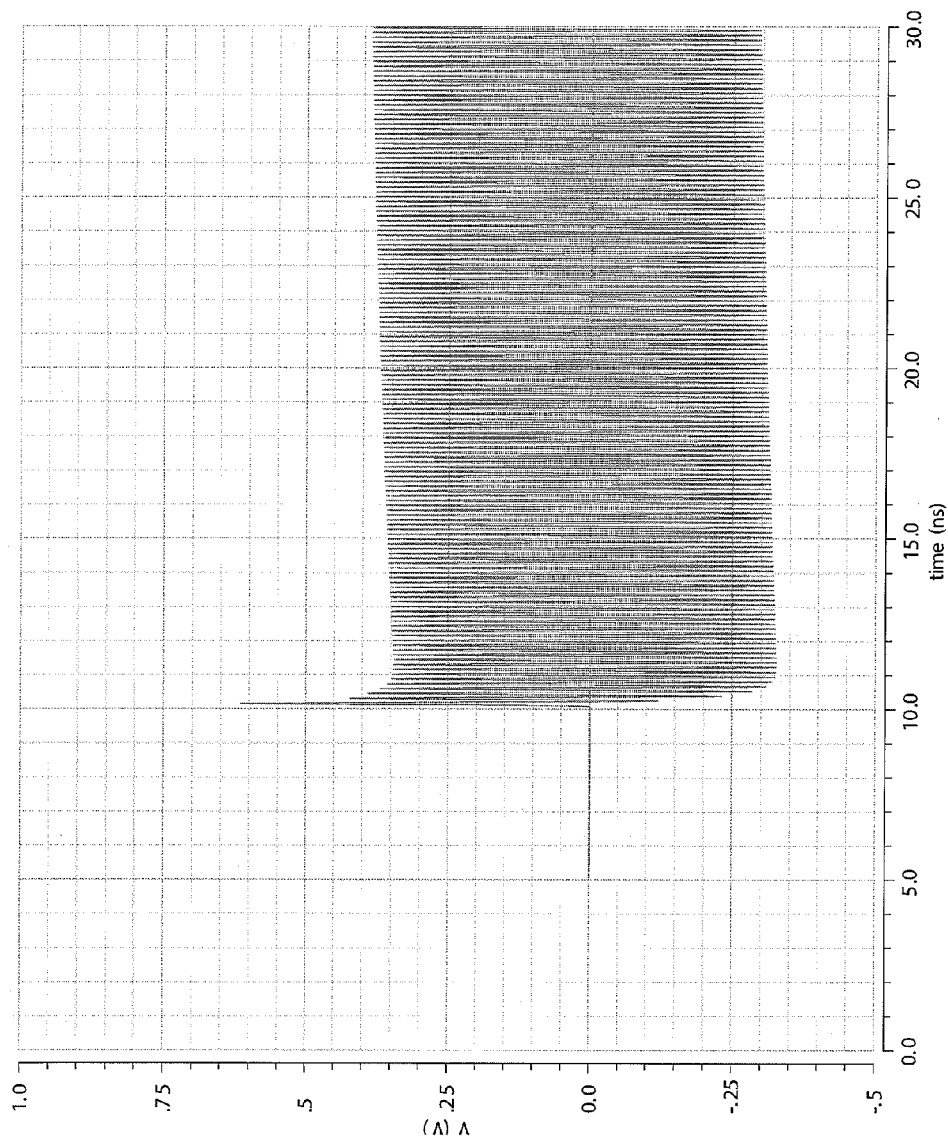
Figures 3, 8:
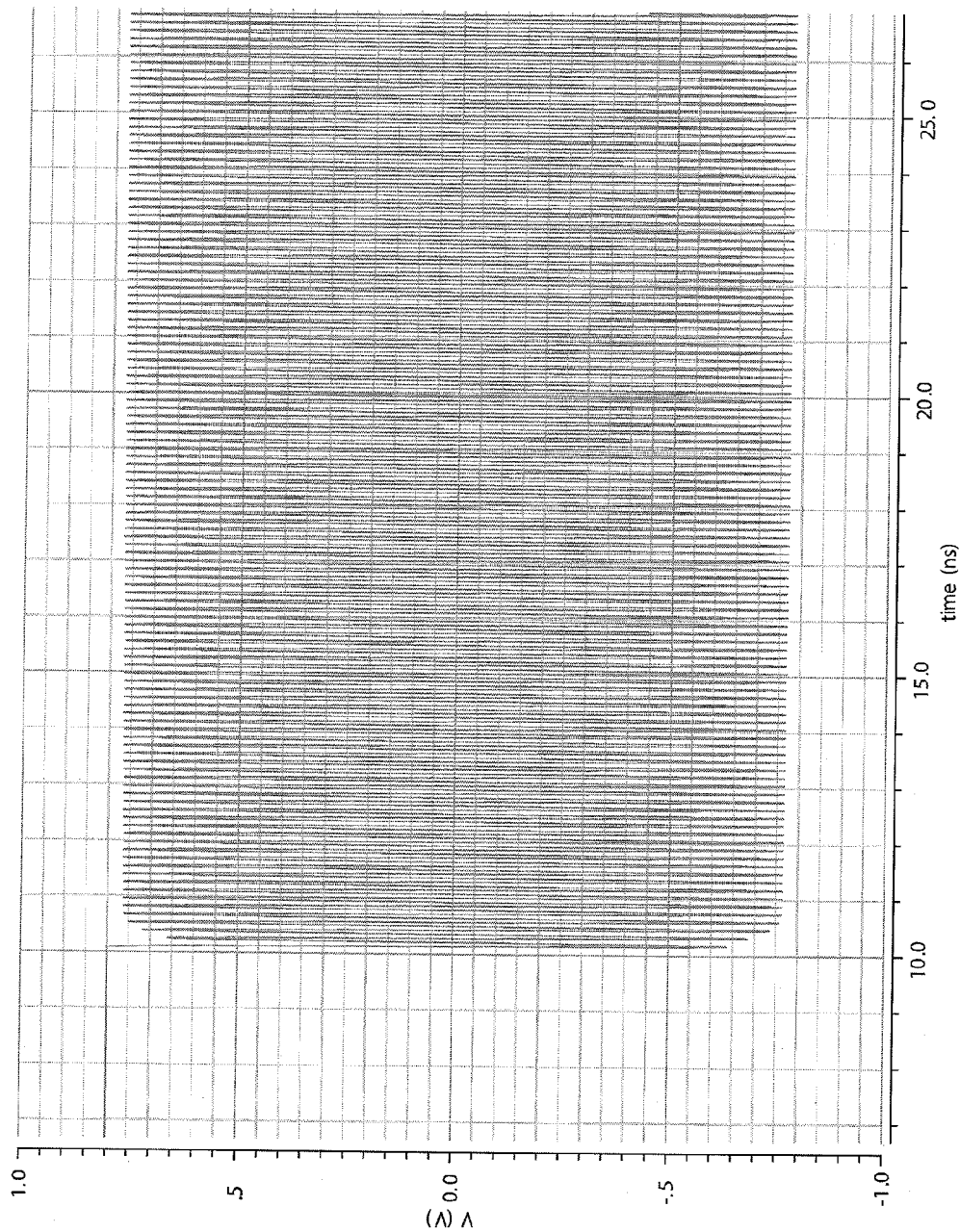
Figures 4, 8:
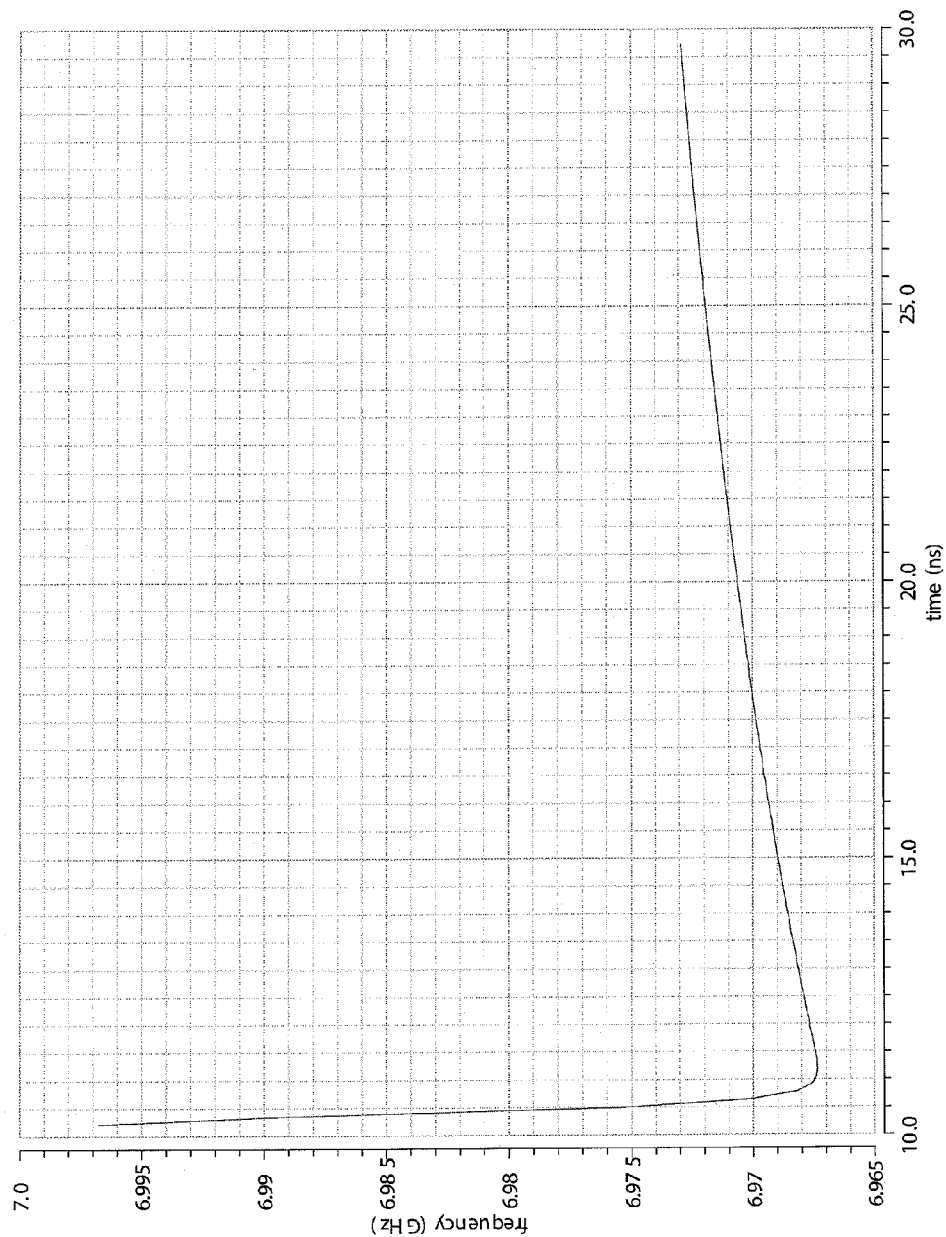

FIGS. 8-1 through 8-4 illustrate performance of an oscillator circuit without initialization of the adjustable capacitive circuit to limit charging of disabled capacitive branch circuits when operating the oscillator in the first mode discussed above. FIG. 8-1 shows a waveform illustrating the voltage at a first node of an adjustable capacitive circuit during startup of an oscillator circuit without initialization of the adjustable capacitive circuit. FIG. 8-2 shows a waveform illustrating the voltage at a second node of an adjustable capacitive circuit during startup of an oscillator circuit without initialization of the adjustable capacitive circuit. The waveforms shown in FIGS. 8-1 and 8-2 may be exhibited at nodes A and B in the oscillator circuit shown in FIG. 4 if the initialization circuit, 472 and 474, is not used to limit charging of capacitors in disabled capacitive branch circuits in the first mode of operation. As previously discussed, when oscillation begins, charge on capacitor 452 can initially push node A below ground. As shown in FIG. 8-1, node A initially oscillates in a lower voltage range than that of stable oscillation. From approximately 10 ns to 12 ns, charge is gradually transferred to node A and the voltage range of oscillation at node A increases. Conversely, charge on capacitor 454 can also initially push node B above Vdd. As shown in FIG. 8-2, node B initially oscillates in a higher voltage range than that of stable oscillation. From approximately 10 ns to 12 ns, charge is gradually transferred to node B and the voltage range of oscillation at node B decreases.

FIG. 8-3 shows an oscillating signal generated during startup of an oscillator circuit without initialization of an adjustable capacitive circuit to limit charging of disabled capacitive branch circuits in the first mode. The oscillation signal represents a difference in voltage between nodes RF+ and RF− in FIG. 4. As shown in FIG. 8-3, due to capacitive loading to the rest of the LC circuit by disabled capacitive branch circuits, differential voltage drops suddenly when oscillation is enabled and then the amplitude gradually grows to the stable amplitude. In this example, it takes approximately 1 ns after oscillation is enabled to stabilize the amplitude of the oscillation signal.

FIG. 8-4 shows the oscillation frequency of an oscillator circuit during startup without initialization of an adjustable capacitive circuit included in the oscillator circuit. As previously described, charge of disabled capacitive branch circuits may partially load the LC circuit initially when the oscillation is enabled. The capacitive loading of the disabled capacitive branch circuits decreases over time as energy is transferred to the LC circuit. As a result of this variation in capacitive loading, the self-resonant frequency of the oscillator circuit varies over time. When the oscillation is enabled, the self-resonant frequency quickly swings from approximately 7 GHz down to 6.97 GHz between 10 ns to 12 ns in FIG. 8-4. From 12 ns to 30 ns in FIG. 8-4, the oscillation frequency slowly increases from approximately 6.97 GHz up to 6.9725 GHz.

Figures 1, 9:
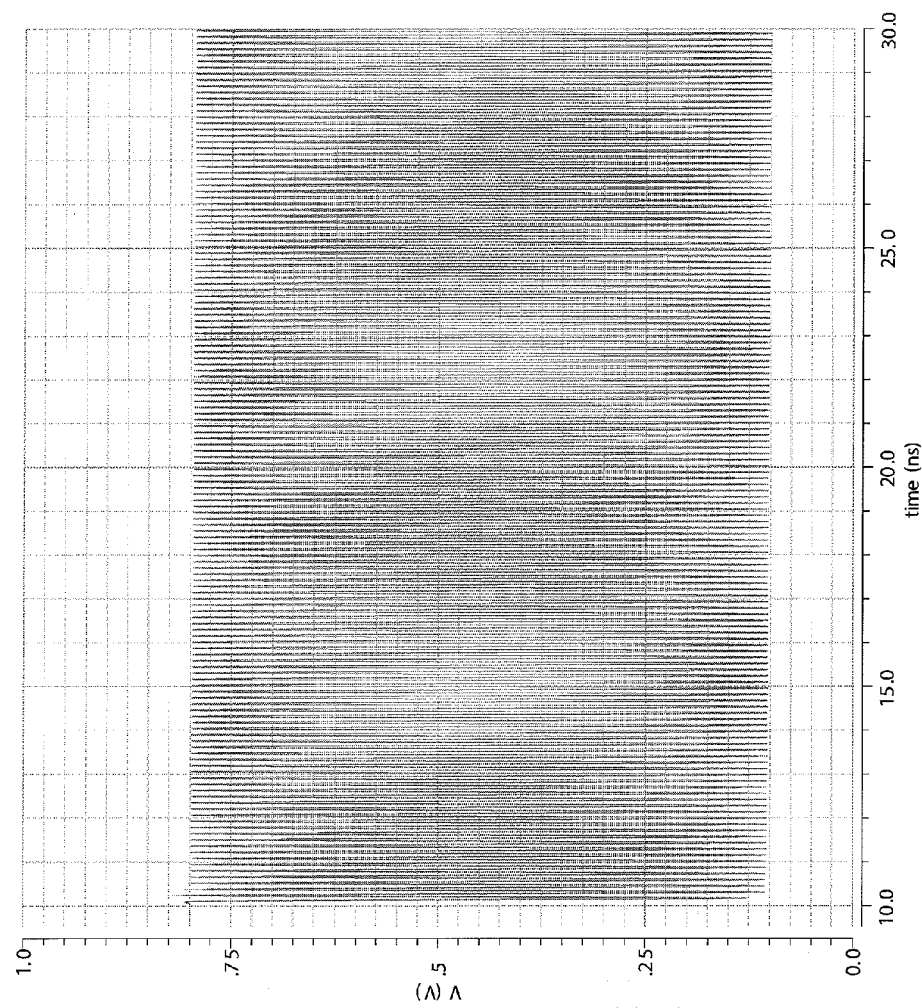
Figures 2, 9:
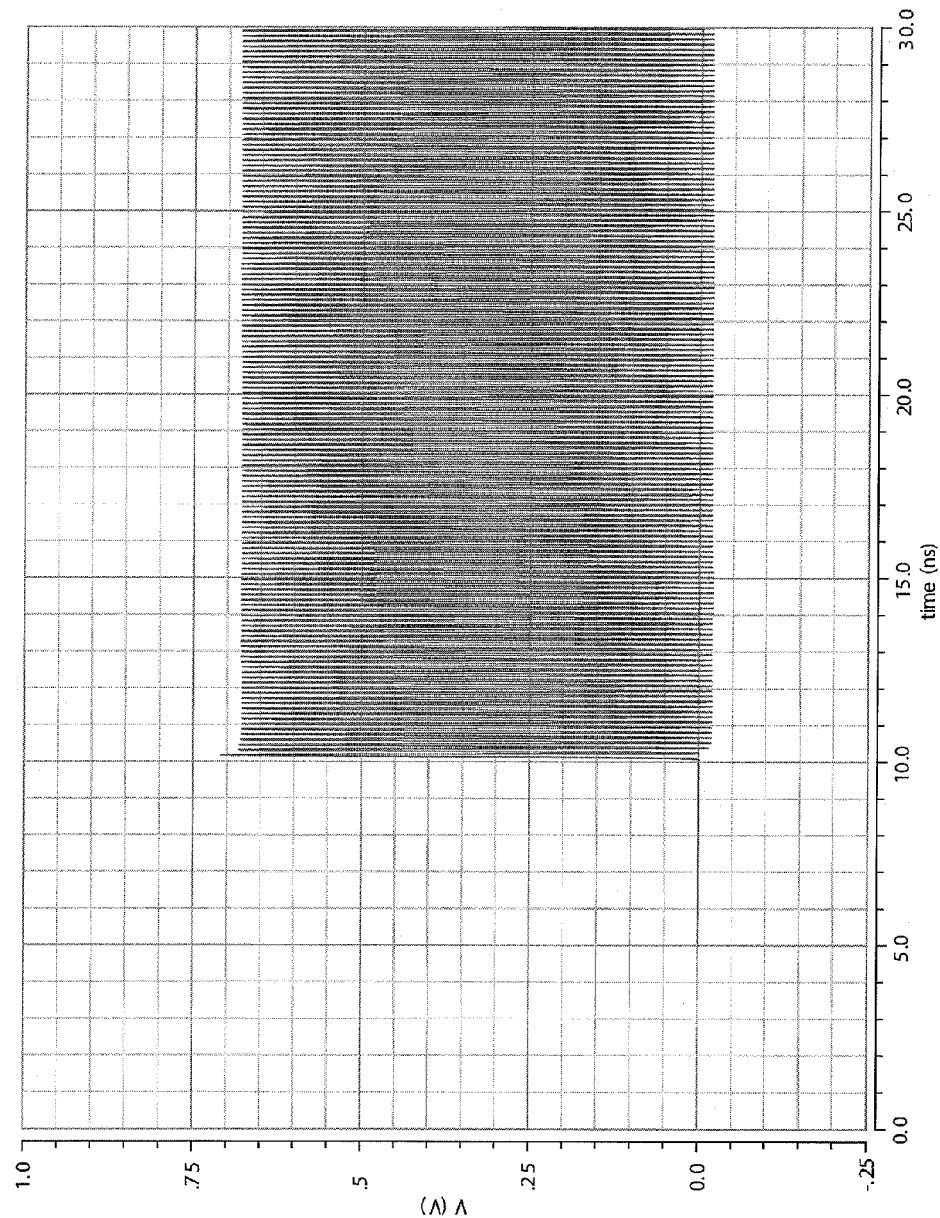
Figures 3, 9:
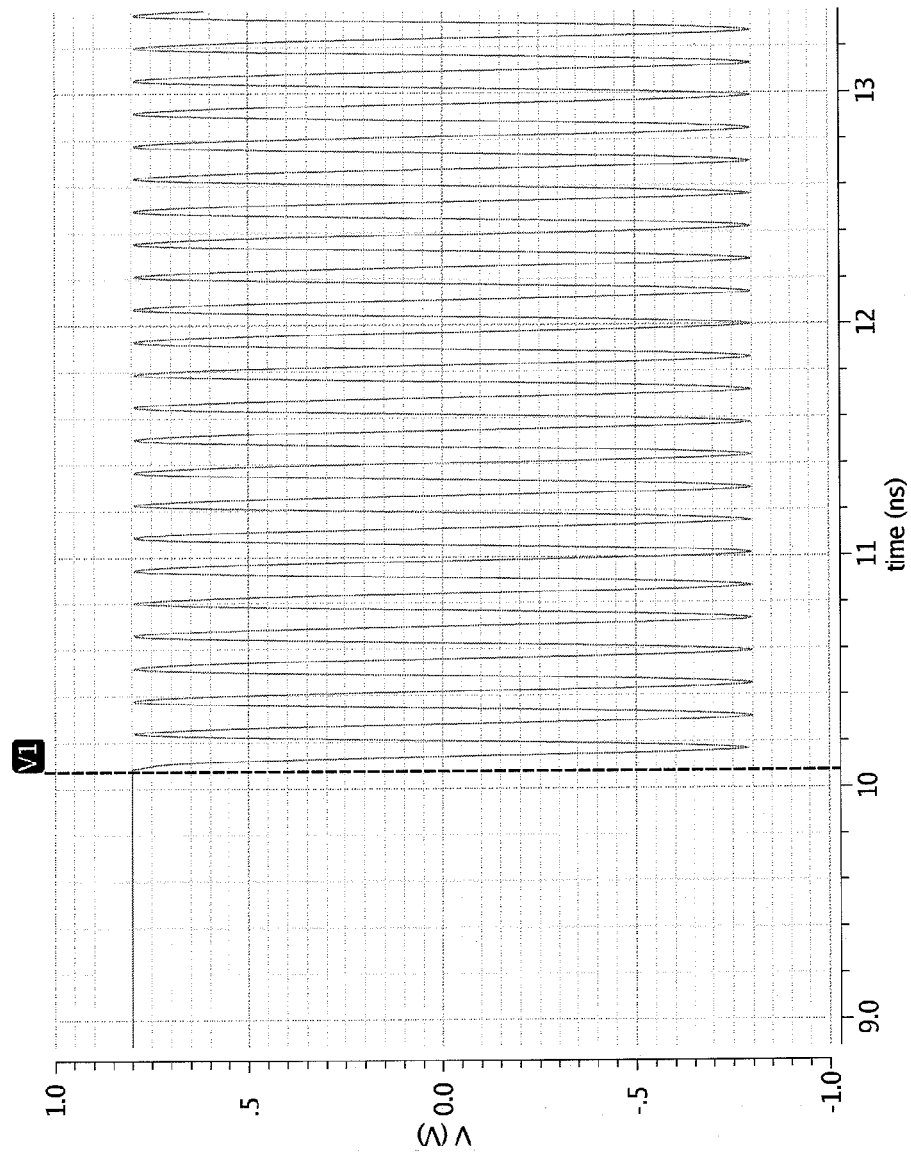
Figures 4, 9:
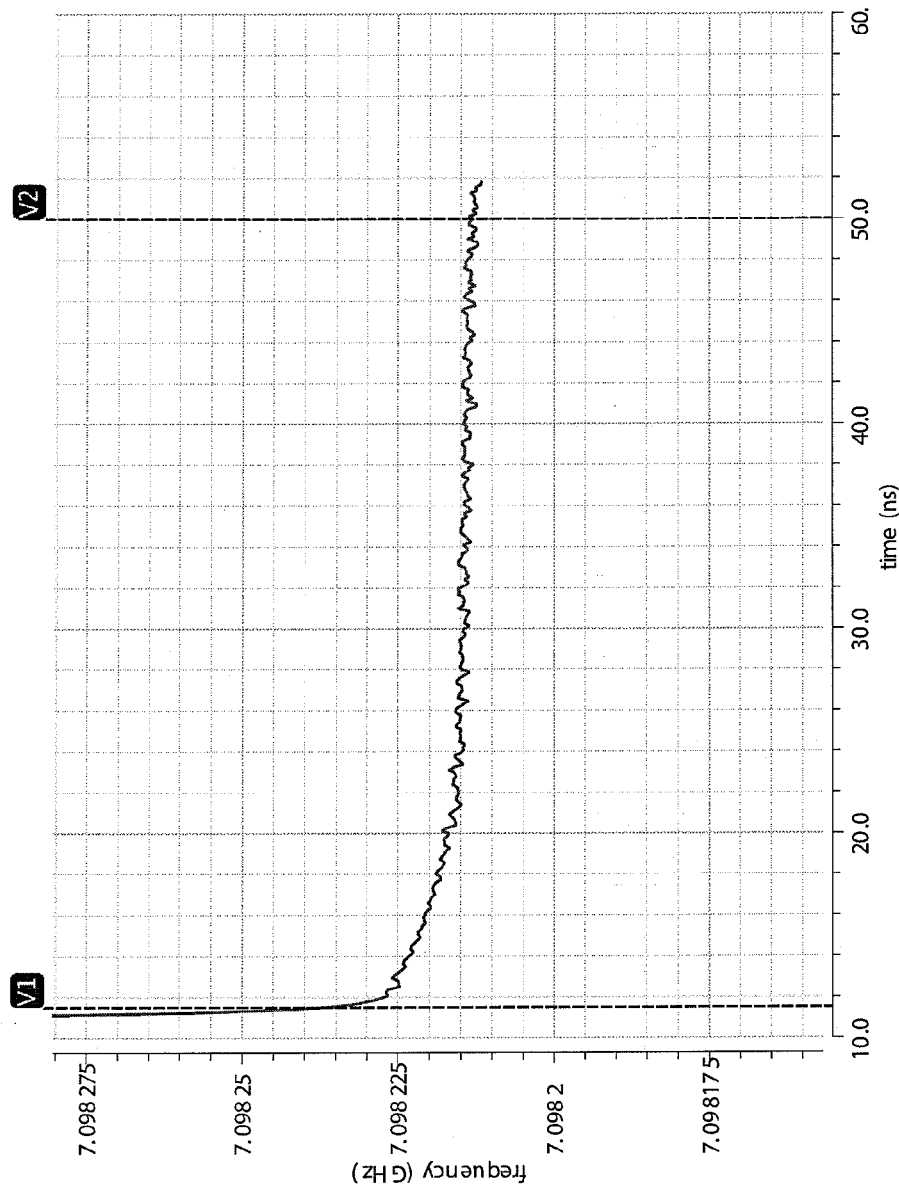

FIGS. 9-1 through 9-4 illustrate performance of an oscillator circuit with initialization of the adjustable capacitive circuit to limit charging of disabled capacitive branch circuits when operating the oscillator in the first mode discussed above. FIG. 9-1 shows a waveform illustrating voltage at a first node of an adjustable capacitive circuit (e.g., node A in FIG. 4) during startup of an oscillator circuit with initialization of the adjustable capacitive circuit. When the oscillation is enabled at 10 ns, node A settles into oscillation in the voltage range of the stable oscillation signal nearly instantaneously. In comparison to FIG. 8-1, initial oscillation outside of the voltage range of the stable oscillation signal is dramatically reduced. FIG. 9-2 shows a waveform illustrating voltage at a second node of an adjustable capacitive circuit (e.g., node B in FIG. 4) during startup of an oscillator circuit with initialization of the adjustable capacitive circuit. When the oscillation is enabled at 10 ns, node B settles into oscillation in the voltage range of the stable oscillation signal nearly instantaneously. In comparison to FIG. 8-2, initial oscillation outside of the voltage range of the stable oscillation signal is dramatically reduced.

FIG. 9-3 shows an oscillating signal generated during startup of an oscillator circuit with initialization of an adjustable capacitive circuit to limit charging of disabled capacitive branch circuits in the first mode. The oscillation signal represents a difference in voltage between nodes RF+ and RF− in FIG. 4. As shown in FIG. 9-3, amplitude of the oscillation stabilizes within 0.1 ns, which is within 1 oscillation cycle. In comparison to the oscillation signal shown in FIG. 8-3, settling time of the differential amplitude of oscillation signal is reduced. In this example, the differential amplitude of the oscillation signal is reduced approximately by a factor of 10 in comparison to the oscillation signal shown in FIG. 8-3.

FIG. 9-4 shows the oscillation frequency of an oscillator circuit during startup with initialization of an adjustable capacitive circuit included in the oscillator circuit. As previously described, oscillation frequency of an oscillator may vary during a burst due to partially loading the LC circuit by charge on disabled capacitive branch circuits. When charging of disabled capacitive branch circuits is limited in the first mode, the frequency shift is reduced. As shown in FIG. 4, resonant frequency of the oscillation circuit drops from approximately 7.0982400 GHz to 7.0982125 GHz from 10 ns to 22 ns (a difference of 0.0275 MHz). In comparison, the resonant frequency shown in FIG. 8-4 varied over a frequency range of approximately 2.5 MHz.

Figure 10:
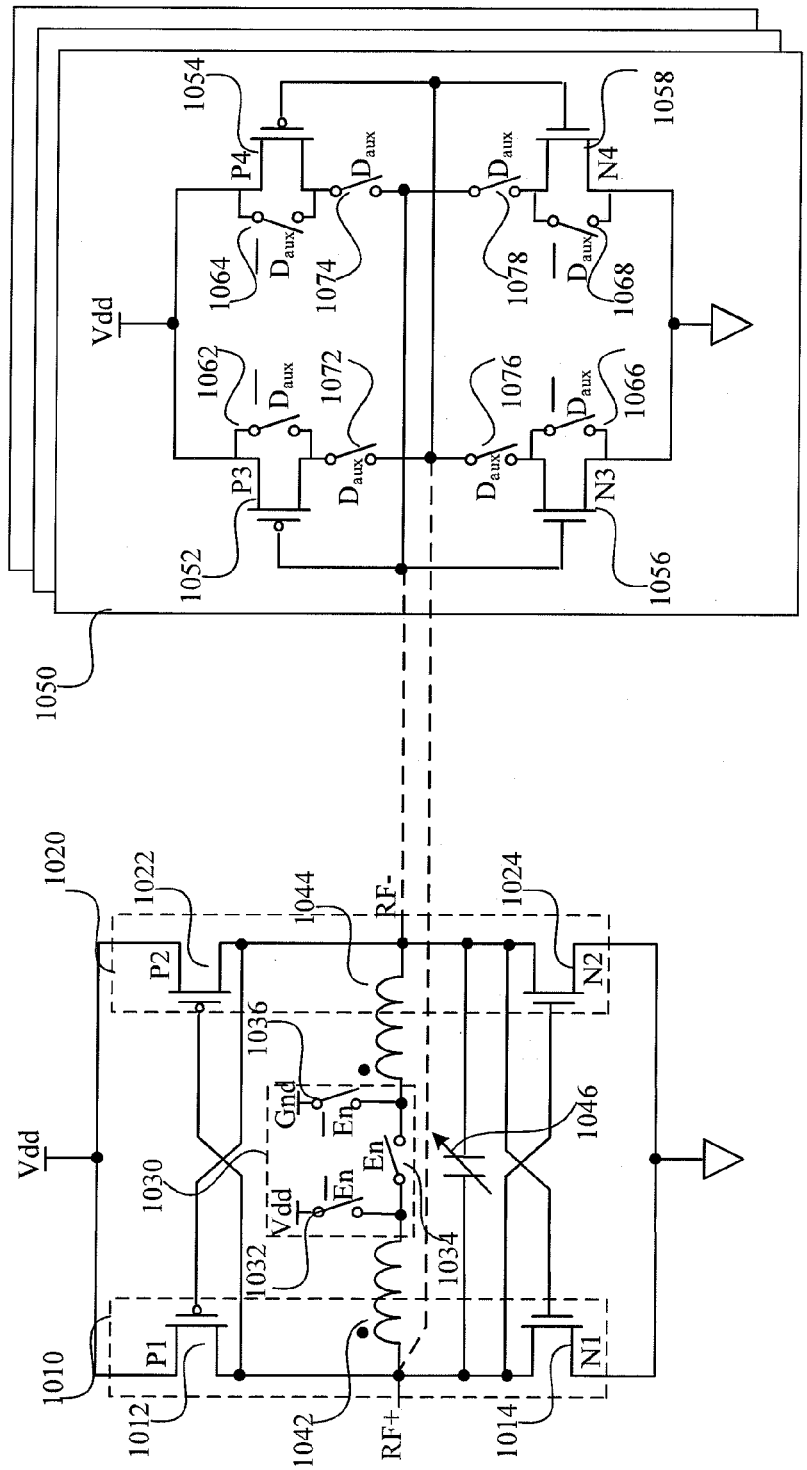
FIG. 10 shows an oscillator circuit with auxiliary circuits, consistent with one or more embodiments of the present disclosure.

FIG. 10 shows a fourth example oscillator circuit, consistent with one or more embodiments of the present disclosure. The oscillator includes a capacitive circuit 1046, inductive elements 1042 and 1044, a switching circuit 1030, and cross-coupled inverter circuits 1010 and 1020 configured and arranged as described with reference to the capacitive circuit 446, the inductive elements 442 and 444, the switching circuit 430, and the cross-coupled inverter circuits 410 and 420 shown in FIG. 4.

As previously described, the self-resonant frequency of an LC circuit, formed by the capacitive circuit 1046 and inductive elements 1042 and 1044, is primarily determined by the amount of capacitance provided by capacitive circuit 1046, and the inductance provided by the inductive elements 1042 and 1044. Specifically, the self-resonant frequency $f_0$ of the LC circuit in Hertz is given by:

$$f_0 = \frac{1}{2\pi\sqrt{LC}}$$

where L is the inductance provided by the inductive circuit and C is the capacitance provided by the capacitive circuit. The oscillation frequency of the oscillator may be adjusted by adjusting L, C, or both. In this example, the oscillator circuit includes a variable capacitive circuit 1046 that may be programmed to provide various different capacitance values, such as through the use of switched capacitive banks. In this manner, the variable capacitive circuit 1046 may be adjusted to configure the oscillator circuit to operate at various different oscillating frequencies. Additionally or alternatively, the oscillator circuit may include a variable inductive circuit that may be programmed to provide various amounts of inductance.

As previously described, the inverters formed by transistors 1012, 1014, 1022, and 1024 are configured to follow and reinforce the oscillation of the LC circuit. Reinforcing of the oscillation signal by the inverters helps to overcome losses in the LC circuit and maintain the oscillation and amplitude. Various embodiments recognize that the RF signal amplitude at steady-state may not correspond to the pre-charged voltage for the capacitive circuit 1046. For instance, the mismatch in voltages can be the result of shifting of the real part of the impedance of the LC circuit when the oscillation frequency of the oscillator is tuned, for example, through a switched capacitor bank. The differences in amplitudes can result in a mismatch between the oscillation frequency at startup and the oscillation frequency once the steady-state amplitude of the RF signal is reached.

In some embodiments, an oscillator circuit may include one or more auxiliary circuits configured to adjust the transconductance provided to the LC circuit so that the steady-state RF signal amplitude matches the pre-charged voltage for the capacitive circuit. Moreover, the real part of the impedance of the LC circuit can vary according to the frequency of the RF signal. In some implementations, the auxiliary circuits may be configured, for example, to adjust the transconductance provided to the LC circuit to compensate for the change in the real part of the impedance of the LC circuit to further maintain a constant amplitude over a wide range of frequencies. Various embodiments are based upon the recognition that the single-ended peak-to-peak amplitude for RF+/- signal at steady state may not correspond to the pre-charged voltage for the capacitive circuit. For instance, assuming that the pre-charged voltage remains fixed, changes to the oscillation frequency will result in the differences between the pre-charged voltage and the amplitude of oscillation at the different frequencies. This can result in a difference between the amplitude at startup and the steady-state amplitude of the RF signal. Accordingly, a plurality of auxiliary circuits can be provided to compensate for this mismatch by increasing the reinforce current. For example, enabling more cores has the effect of increasing the effective transistor widths of the main core, therefore increasing the reinforcement of the current during oscillation. This has a similar effect as increasing the biasing current for designs that include a biasing transistor. Thus, more auxiliary cores can be enabled to compensate for a reduction in oscillator amplitude due to a decrease in frequency.

In the example shown in FIG. 10, the circuit includes a plurality of auxiliary circuits 1050. Each of the auxiliary circuits 1050 is configured to provide voltage biasing, in response to being enabled (e.g., in response to control signal $D_{aux}$), that adjusts the effective transconductance provided to the LC circuit. In this example, each auxiliary circuit 1050 includes a set of transistors 1052, 1054, 1056, and 1058 configured to adjust the transconductance to that of the transistors 1012, 1014, 1022, and 1024 when the auxiliary circuit 1050 is enabled.

The auxiliary circuit 1050 includes a first set of switches 1072, 1074, 1076, and 1078 configured to electrically connect each of the transistors 1052, 1054, 1056, and 1058 in parallel with respective transistors 1012, 1014, 1022, and 1024 when the auxiliary circuit 1050 is enabled. When the auxiliary circuit 1050 is disabled, the first set of switches 1072, 1074, 1076, and 1078 disconnect the transistors 1052, 1054, 1056, and 1058 from the transistors 1012, 1014, 1022, and 1024. The auxiliary circuit 1050 includes a second set of switches 1062, 1064, 1066, and 1068 configured to couple the source of each of the transistors 1052, 1054, 1056, and 1058 to the drain of each of the transistors when the auxiliary circuit 1050 is disabled. When the auxiliary circuit 1050 is enabled, each of the switches 1062, 1064, 1066, and 1068 uncouples the source and drain of one of each of the transistors 1052, 1054, 1056, and 1058 from one another.

The disclosed examples and embodiments may be adapted for use in a variety of applications utilizing oscillator circuits. As previously indicated, the examples and embodiments may be particularly applicable to applications that duty-cycle oscillator circuits.

Figure 11:
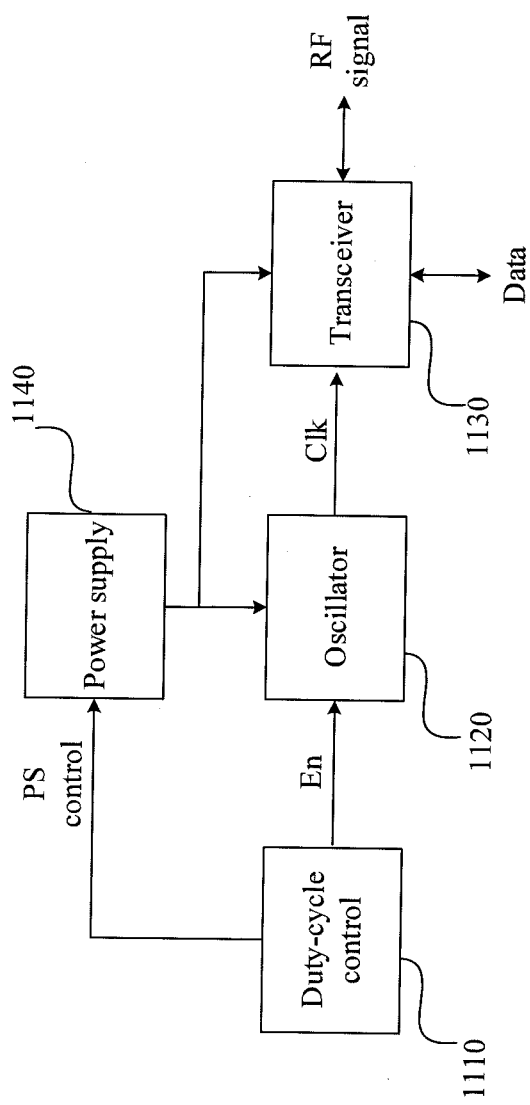
FIG. 11 shows a communication system configured for duty-cycled operation, consistent with one or more embodiments of the present disclosure.

As an illustrative example, FIG. 11 shows a communication system configured for duty-cycled operation. The communication system 1100 includes a transceiver circuit 1130 configured to transmit and receive RF signals using an oscillation signal derived from an oscillator circuit 1120. For instance, the transceiver circuit 1130 may utilize the oscillation signal to control sampling of a transmission medium or to generate an RF signal for transmission over the transmission medium. The oscillator circuit may be implemented, for example, using circuits shown in FIGS. 1, 2, 4-7. In this example, the oscillation signal is depicted as being generated directly from the oscillator circuit 1120. In some implementations, the communication system may include various additional circuits for processing the oscillation signal output by the oscillator circuit 1120 before it is provided to the transceiver 1130. As one example, the communication system 1100 may include a phase-locked loop (PLL) (not shown) configured to prevent phase drift in the oscillation signal. As another example, the communication system 1100 may include a frequency divider configured to generate a second signal oscillating at a lower frequency.

The communication system 1100 includes a duty-cycle control circuit 1110 configured to duty-cycle the oscillator circuit 1120 when the transceiver circuit 1130 is idle. In some embodiments, the transceiver circuit 1130 may include a pulse-based transmitter (e.g., an IR-UWB transmitter) configured to transmit data using short pulses. An IR-UWB transmitter may encode data using various modulation schemes including, for example, PSK, ASK, FSK, or PPM. Similarly, the transceiver circuit 1130 may include a pulse-based receiver (e.g., an IR-UWB receiver) configured to receive data encoded in pulses of a RF signal.

The duty-cycle control circuit 1110 may be configured to operate the oscillator circuit 1120 in an inactive or powered down state when the pulse-based transmitter is inactive (e.g., between transmitted pulses). In some embodiments, the duty-cycle control circuit 1110 may also duty-cycle operation of various other circuits including, for example, a power supply 1140 used to power the oscillator circuit 1120 and/or transceiver circuits 1130.

The duty-cycle control circuit may alternate between operating the oscillator circuit 1120 in a first inactive state and a second active state, for example, using the process shown in FIG. 3. For instance, the duty-cycle control circuit 1110 may power down an LC circuit and inverter circuits of the oscillator 1120 during a time when the RF signal is not used (e.g., between pulses of the RF signal). The duty-cycle control circuit 1110 may power down the LC circuit and inverter circuits by disabling the power supply 1140. The duty-cycle control circuit 1110 can power up an LC circuit and inverter circuits of the oscillator 1120 during a time when the RF signal is used to generate data pulses for transmission. As described with reference to FIG. 3, powering up the LC circuit and inverter circuits may include setting a switching circuit included in an inductive circuit of the LC circuit to operate in the first mode that prevents oscillation and charges the LC circuit after the power supply 1140 is enabled. After enabling the power supply, the switching circuit is set to operate in the second mode, in which the oscillation of the LC circuit is enabled.

Various blocks, modules or other circuits may be implemented to carry out one or more of the operations and activities described herein and/or shown in the figures. In these contexts, a "block" (also sometimes "logic circuitry" or "module") is a circuit that carries out one or more of these or related operations/activities (e.g., enabling/preventing the oscillation, charging capacitive circuits, or controlling duty-cycled operation of circuits). For example, in certain of the above-discussed embodiments, one or more modules are discrete logic circuits or programmable logic circuits that are configured and arranged for implementing these operations/activities, as in process/circuit modules shown in FIGS. 1-7 and 10. In certain embodiments, such a programmable circuit is one or more computer circuits programmed to execute a set (or sets) of instructions (and/or configuration data). The instructions (and/or configuration data) can be in the form of firmware or software stored in and accessible from a memory (circuit). As an example, first and second modules include a combination of a CPU hardware-based circuit and a set of instructions in the form of firmware, where the first module includes a first CPU hardware circuit with one set of instructions and the second module includes a second CPU hardware circuit with another set of instructions. Certain embodiments are directed to a computer program product (e.g., nonvolatile memory device), which includes a machine or computer-readable medium having stored thereon instructions which may be executed by a computer, system-on-chip, programmable IC, or other electronic device to perform these operations/activities.

Based upon the above discussion and illustrations, those skilled in the art will readily recognize that various modifications and changes may be made to the various embodiments without strictly following the exemplary embodiments and applications illustrated and described herein. For instance, although aspects and features may in some cases be described in individual figures, it will be appreciated that features from one figure can be combined with features of another figure even though the combination is not explicitly shown or explicitly described as a combination. Such modifications do not depart from the true spirit and scope of various aspects of the invention, including aspects set forth in the claims.

What is claimed is:

1. An apparatus, comprising:
an LC circuit including an adjustable capacitive circuit and an inductive circuit connected in a circuit loop with a first end of the adjustable capacitive circuit coupled to a first node and a second end of the adjustable capacitive circuit coupled to a second node;
wherein the inductive circuit includes one or more inductive elements and a switching circuit configured and arranged to
in a first mode, provide a direct-current (DC) charge voltage across the LC circuit and prevent oscillation of energy between the capacitive circuit and the inductive circuit by opening a switch in the circuit loop of the LC circuit, and
in a second mode, enable the oscillation of energy between the capacitive circuit and the inductive circuit by closing the switch in the circuit loop; and
wherein the adjustable capacitive circuit includes
a plurality of capacitive branch circuits, each having a respective set of capacitors and configured and arranged to contribute a first amount of capacitance between the first and second nodes when enabled and a second lesser amount of capacitance when disabled; and
an initialization circuit configured and arranged to, for each of the plurality of capacitive branch circuits, couple the capacitor branch circuit to a respective reference voltage in response to the capacitive branch circuit being disabled and the switching circuit operating in the first mode.

2. The apparatus of claim 1, each capacitive branch circuit of the plurality of capacitive branch circuits includes a respective switching circuit configured and arranged to:
in an enabled mode, complete a respective circuit path, including the respective set of capacitors, between the first and second nodes, and
in a disabled mode, break the circuit path between the first and second nodes.

3. The apparatus of claim 2, wherein:
the respective switching circuit in each capacitive branch circuit includes at least one transistor-based switch or parasitic PN junction subject to being turned on when an oscillating voltage is presented across the adjustable capacitive circuit, and
the initialization circuit is configured and arranged to maintain voltages of nodes in the capacitor branch circuits within a voltage range of a rail-to-rail supply voltage used to power the LC circuit.

4. The apparatus of claim 2, wherein the initialization circuit is configured and arranged to, for each of the plurality of capacitive branch circuits, limit, in response to a respective first control signal, charging of the set of capacitors.

5. The apparatus of claim 2, wherein
the respective set of capacitors in each capacitive branch circuit includes:
a first capacitor having a first anode/cathode coupled to the first node and a second anode/cathode; and
a second capacitor having a first anode/cathode coupled to the second node and a second anode/cathode; and
the respective switching circuit in each capacitive branch circuit includes a transistor-based switch having a first end coupled to the second anode/cathode of the first capacitor and a second end coupled to the second anode/cathode of the second capacitor.

6. The apparatus of claim 5, wherein the initialization circuit includes, for each of the plurality of capacitive circuits,
a first switch having a first end coupled to the second anode/cathode of the first capacitor and a second end coupled to a first power terminal, and
a second switch having a first end coupled to the second anode/cathode of the second capacitor and a second end coupled to a second power terminal.

7. The apparatus of claim 1, wherein:
the one or more inductive elements includes a first inductor coil having a first end coupled to the first node and a second end, and a second inductor coil magnetically coupled with the first inductor coil and having a first end coupled to the second node and a second end; and
the switching circuit of the inductive circuit is further configured and arranged to:
in the first mode, uncouple the second end of the first inductor coil from the second end of the second inductor coil, couple the second end of the first inductor coil to a first power terminal, and couple the second end of the second inductor coil to a second power terminal; and
in the second mode, uncouple the second end of the first inductor coil from the first power terminal, uncouple the second end of the second inductor coil from the second power terminal, and couple the second end of the first inductor coil to the second end of the second inductor coil.

8. The apparatus of claim 7, wherein:
the switching circuit of the inductive circuit is configured and arranged to operate in the first mode in response to a first control signal and operate in the second mode in response to a second control signal; and
the switching circuit of the inductive circuit includes
a first switch configured and arranged to couple the second end of the first inductor coil to the second end of the second inductor coil in response to the second control signal and to uncouple the second end of the first inductor coil from to the second end of the second inductor coil in response to the first control signal;
a second switch configured to couple the second end of the first inductor coil to the first power terminal in response to the first control signal and to uncouple the second end of the first inductor coil from the first power terminal in response to the second control signal; and
a third switch configured to couple the second end of the second inductor coil to the second power terminal in response to the first control signal and to uncouple the second end of the second inductor coil from the second power terminal in response to the second control signal.

9. The apparatus of claim 1, further comprising an amplifier circuit coupled to the LC circuit and configured and arranged to sustain the oscillation of the LC circuit.

10. The apparatus of claim 9, wherein the amplifier circuit includes:
a first inverter circuit having a first input coupled to the first node and a first output coupled to the second node; and
a second inverter circuit having a second input coupled to the first output and a second output coupled to the first input.

11. The apparatus of claim 10, wherein:
each of the first and second inverter circuits includes a P-type transistor having a source coupled to a first power terminal and includes an N-type transistor having a drain coupled to a drain of the P-type transistor and a source coupled to a second power terminal; and
the apparatus further comprises a circuit configured to contribute additional transconductance to that of the P type transistor and the N type transistor of each of the inverter circuits.

12. The apparatus of claim 11, wherein the circuit configured to contribute additional transconductance includes a plurality of auxiliary circuits, each auxiliary circuit having
a respective set of transistors including two P-type transistors and two N-type transistors;
a respective first set of switches configured to
when enabled, electrically connect each N-type transistor of the set of transistors in parallel with the N-type transistor of a respective one of the first and second inverter circuits and electrically connect each P-type transistor of the set of transistors in parallel with the P-type transistor of a respective one of the first and second inverter circuits, and
when disabled, electrically disconnect the set of transistors from the first and second inverter circuits; and
a respective second set of switches configured to, for each of the set of transistors, couple a source of the transistor to a drain of the transistor when enabled and uncouple the source of the transistor from the drain of the transistor when disabled.

13. An adjustable capacitive circuit, comprising:
a first node;
a second node;
a plurality of capacitive branch circuits, each including a respective set of capacitors and configured and arranged to
in an enabled mode, contribute a first amount of capacitance between the first and second nodes and
in a disabled mode, contribute a second lesser amount of capacitance between the first and second nodes;
an initialization circuit configured and arranged to, for each of the plurality of capacitive branch circuits that is disabled,
in a first mode, couple the set of capacitors of the capacitive branch circuit to a respective reference voltage in response to the capacitive branch circuit being disabled, and
in a second mode, uncouple the set of capacitors of the capacitive branch circuit from the respective reference voltage; and
an additional switch coupled to couple the second node and the reference voltage, wherein the additional switch is configured to stay disabled at all times.

14. The adjustable capacitive circuit of claim 13, wherein
each capacitive branch circuit in the plurality of capacitive branch circuits includes a respective switching circuit coupled to the respective set of capacitors and configured and arranged to in the enabled mode, complete a respective circuit path including the capacitive circuit between the first and second nodes, and in the disabled mode, break the circuit path between the first and second nodes, wherein the respective switching circuit in the capacitive branch circuit includes at least one transistor-based switch PN junction subject to being turned on when an oscillating voltage is provided across the first and second nodes; and the initialization circuit is configured and arranged to maintain voltages of nodes in the capacitor branch circuits within a voltage range of a rail-to-rail supply voltage used to power a LC circuit while the respective switching circuit in the capacitive branch circuit is operated in the disabled mode and the oscillating voltage is provided across the first and second nodes.

15. The adjustable capacitive circuit of claim 14, wherein the initialization circuit is configured and arranged to limit, in response to a respective first control signal, charging of the set of capacitors.

16. The adjustable capacitive circuit of claim 14, wherein in each capacitive branch circuit:

the respective set of capacitors includes:
a first capacitor having a first anode/cathode coupled to the first node and a second anode/cathode; and
a second capacitor having a first anode/cathode coupled to the second node and a second anode/cathode; and the transistor-based switch having a first end coupled to the second anode/cathode of the first capacitor and a second end coupled to the second anode/cathode of the second capacitor.

17. The adjustable capacitive circuit of claim 14, wherein the initialization circuit further includes a first switch having a first end coupled to the first end of the transistor-based switch and second end coupled to a ground voltage; and a second switch having a first end coupled to the second end of the transistor-based switch and second end coupled to a source voltage.

18. A method for operating an LC circuit including an adjustable capacitive circuit and an inductive circuit connected in a circuit loop, the method comprising:

enabling a subset of a plurality of capacitor branch circuits in the adjustable capacitive circuit and disabling other ones of the plurality of capacitor branch circuits, each of the plurality of capacitor branch circuits including a respective set of capacitors and configured and arranged to provide a first capacitance between first and second nodes when enabled and provide a second lesser capacitance between the first and second nodes when disabled;

in a first mode,
disabling oscillation of the LC circuit by opening a switch in the circuit loop,
for each of the plurality of capacitive branch circuits that is disabled, using an initialization circuit in the adjustable capacitive circuit to couple the set of capacitors in the capacitive branch circuit to a respective reference voltage, and
charging the capacitive circuit by providing a charge voltage across the LC circuit; and in a second mode, enabling the oscillation of the LC circuit by closing the switch in the circuit loop, wherein the charge on the capacitive circuit causes the LC circuit to oscillate with a single-ended peak-to-peak amplitude equal to the charge voltage of the capacitive circuit nearly instantaneously after the oscillation is enabled, wherein a parasitic capacitance is introduced in the adjustable capacitive circuit using a switch that stays open at all times.

19. The method of claim 18, wherein the oscillation of the LC circuit generates an oscillating signal at first and second nodes; and further comprising, using the oscillating signal, driving the oscillation of a pair of cross-coupled inverter circuits, a first inverter of the pair having an input coupled to an output of a second inverter of the pair and an output coupled to an input of the second inverter of the pair.

20. The method of claim 18, wherein for each of the capacitive branch circuits,
enabling the capacitive branch circuit includes using a respective switching circuit in the capacitive branch circuit coupled to the respective set of capacitors, completing a respective circuit path including the capacitive circuit between the first and second nodes,
disabling the capacitive branch circuit includes, using the respective switching circuit in the capacitive branch circuit, breaking the circuit path between the first and second nodes, and the respective switching circuit in the capacitive branch circuit includes at least one transistor-based switch or PN junction subject to being turned on when an oscillating voltage is provided across the first and second nodes; and the initialization circuit is configured and arranged to maintain voltages of nodes in the capacitor branch circuits within a voltage range of a rail-to-rail supply voltage used to power the LC circuit.

* * * * *